United States Patent
Maeda et al.

[11] Patent Number: 6,166,436
[45] Date of Patent: Dec. 26, 2000

[54] HIGH FREQUENCY SEMICONDUCTOR DEVICE

[75] Inventors: Masahiro Maeda, Osaka; Morio Nakamura, Katano; Takayuki Yoshida, Neyagawa; Masazumi Yamazaki, Kamakura, all of Japan

[73] Assignee: Matsushita Electric Industrial Co., Ltd., Osaka, Japan

[21] Appl. No.: 09/060,600

[22] Filed: Apr. 15, 1998

[30] Foreign Application Priority Data

Apr. 16, 1997 [JP] Japan ................................ 9-099430

[51] Int. Cl.[7] .............................. H01L 21/44; H01L 21/60
[52] U.S. Cl. .......................... 257/723; 257/728; 438/107
[58] Field of Search .................................. 257/728, 401, 257/778; 333/247

[56] References Cited

FOREIGN PATENT DOCUMENTS

| 54-141563 | 11/1979 | Japan . |
|---|---|---|
| 56-094781 | 7/1981 | Japan . |
| 58-044732 | 3/1983 | Japan . |
| 61-35714 | 8/1986 | Japan . |
| 62-55721 | 11/1987 | Japan . |
| 02081446 | 3/1990 | Japan . |
| 04125941 | 4/1992 | Japan . |
| 04151891 | 5/1992 | Japan . |
| 04204741 | 8/1992 | Japan . |
| 4-113472 | 10/1992 | Japan . |
| 5-190563 | 7/1993 | Japan . |
| 06005881 | 1/1994 | Japan . |
| 06140629 | 5/1994 | Japan . |
| 6-44584 | 6/1994 | Japan . |

OTHER PUBLICATIONS

D. Helms et al., 1991 IEEE MTT–S Digest, pp. 819–821, 1991.

H. Sakai et al., 1994 IEEE MTT–S Digest, pp. 1763–1766, 1994.

*Primary Examiner*—Matthew Smith
*Assistant Examiner*—Calom Lee
*Attorney, Agent, or Firm*—Michael K. Kelly; Snell & Wilmer L.L.P.

[57] ABSTRACT

A high frequency semiconductor device includes: a substrate having a substantially flat principal surface, with a predetermined circuit pattern including at least an input line, an output line, and a ground electrode provided on the principal surface; and a transistor which has a drain electrode, a source electrode, and a gate electrode and is mounted on the substrate by a flip chip mounting. The source electrode and the ground electrode are connected to each other by a first bump in the flip chip mounting.

17 Claims, 20 Drawing Sheets

HIGH FREQUENCY SEMICONDUCTOR DEVICE

BACKGROUND OF THE INVENTION

1. Field of the Invention

The present invention relates to a high frequency semiconductor device fabricated using a field effect transistor (also referred to as a "FET" in this specification), in particular, a FET formed on a semi-insulating GaAs substrate or an InP substrate; and a method for fabricating the same. The term "high frequency semiconductor device" herein is used as a general term referring to various types of high frequency devices including a power amplifier, a low-noise amplifier, and a mixer.

2. Description of the Related Art

Due to its excellent high frequency characteristics, demand for a gallium arsenide (GaAs) FET is significantly increasing as a device to be used in a mobile communication device such as a portable telephone. Among others, a GaAs power FET to be used as a power amplifier component in an amplifier for transmission or the like has undergone rapid progress by utilizing such characteristics as its low voltage operation, low power consumption, and low distortion. Moreover, in the near future, a radio system using a millimeter wave band, in addition to a microwave band, is to be utilized for commercial purposes. Therefore, demand for a higher frequency and demand for a lower cost need to be satisfied in one device at the same time.

Hereinafter, a high frequency semiconductor device according to a conventional technique will be described.

FIG. 17 is a plan view schematically illustrating a conventional high frequency GaAs power FET chip 1410.

The FET chip 1410 employs a comb-shaped electrode structure in order to increase the size of a FET included therein. More specifically, a region 1400 surrounded by a dashed line in the FET chip 1410 corresponds to a unit FET. The unit FET includes a source electrode 1401, a gate electrode 1402, and a drain electrode 1403. The FET chip 1410 has, for example, six of the thus formed unit FETs.

The source electrode 1401, the gate electrode 1402, and the drain electrode 1403 are connected to a source electrode pad 1407, a gate electrode pad 1408, and a drain electrode pad 1409, using a source extension line 1404, a gate extension line 1405, and a drain extension line 1406, respectively. Upon mounting the FET chip 1410 on a package, the electrode pads 1407 to 1409 are connected to respective electrodes of the package, for example, by bonding wires.

In general, in the case where the FET is operated at a high power, it is necessary to allow heat generated by such operation to efficiently escape to the outside of the chip. In addition, in order for the FET to operate in a frequency such as a microwave band or a millimeter wave band, it is necessary to reduce a source inductance of the FET. As a method for overcoming these problems, the article "Ku-Band Power Amplifier using Pseudomorphic HEMT Devices for Improved Efficiency" (1991, IEEE MTT-S Digest, pp.819–821) by D. Helms et al. describes that both an improvement in the heat releasing property and a reduction in the source inductance can be realized by (1) grinding a semiconductor substrate to reduce the thickness thereof and (2) providing a via hole immediately below a source electrode and filling the via hole with a metal material.

According to the method disclosed in the aforementioned article, however, a reduced production yield results since cracking of a wafer and the like may be caused by the process of grinding the semiconductor substrate (especially the GaAs substrate) to a thin thickness and forming the via hole.

As a method for mounting a high frequency semiconductor device which prevents the problems as described above from occurring, there is a flip chip mounting method. Japanese Publication for Opposition No. 62-55721, for example, describes a conventional high frequency transistor employing the flip chip mounting.

FIGS. 18A to 18C are views showing the conventional flip chip mounting process according to the aforementioned Japanese Publication for Opposition. More specifically, FIG. 18A is a plan view showing the electrode structure of the high frequency FET disclosed in the aforementioned publication. FIG. 18B is a plan view of a package where the flip chip mounting is performed for the FET chip. FIG. 18C is a cross-sectional view showing a cross section taken along line 18C–18C' in FIGS. 18A and 18B.

In FIG. 18A, bumps 1511, 1512, and 1513 which are Au-plated so as to have a thickness of about 20 $\mu$m are provided on a source electrode 1501, a gate electrode pad 1508, and a drain electrode pad 1509 in a high frequency FET chip 1510, respectively. A gate extension line 1505 connects a gate electrode 1502 with the gate electrode pad 1508, and a drain-gate extension line 1506 connects a drain electrode 1503 with the drain electrode pad 1509.

In FIG. 18B, a metal base 1515 has a convex portion 1519 (see FIG. 18C) on a surface 1515a (i.e., a principal surface 1515a) opposing the FET chip 1510. Alumina substrates 1516 are disposed at both sides of the convex portion 1519 of the metal base 1515. An input line 1517 or an output line 1518 are provided on each of the alumina substrates 1516.

In FIG. 18C, the bump 1511 on the source electrode 1501 is connected to the convex portion 1519 formed on the surface of the metal base 1515. The bump 1512 on the gate electrode pad 1508 is connected to the input line 1517 provided on one of the alumina substrates 1516. The bump 1513 on the drain electrode pad 1509 is connected to the output line 1518 provided on the other alumina substrate 1516.

The aforementioned Japanese Publication for Opposition No. 62-55721 states that (1) an improvement in the high frequency characteristics due to a reduction in the source inductance and (2) an improvement in the heat releasing property can be expected since the source electrode 1501 and the metal base 1515 can be connected to each other via the bump 1511 according to the above-described structure.

As another conventional technique employing the flip chip mounting, Japanese Laid-open Publication No. 5-190563, for example, describes a structure in which one bump is provided immediately above an actual operation region of a transistor element having multi-divided junctions.

In connection with a semiconductor device employing the flip chip mounting, which operates in a band from a quasi-millimeter wave to a millimeter wave, a technique called a millimeter-wave flip-chip IC (MFIC) is explained in the technical article entitled "A Novel Millimeter-Wave IC on Si substrate using Flip-Chip Bonding Technology" by H. Sasaki at al. (1994 IEEE MTT-S Digest, pp. 1763–1766). The MFIC technique employs a specific flip chip mounting technique called a microbump bonding method (also simply referred to as a "MBB method" in this specification).

Hereinafter, steps for fabricating a semiconductor device using the MBB method will be described with reference to FIGS. 19A to 19E which are cross-sectional views sequentially illustrating the fabrication steps employing the MBB method.

First, as shown in FIG. 19A, photocurable insulating resin 1625 is dropped onto a substrate 1621 with transmission lines 1622 provided thereon. Next, as shown in FIG. 19B, bumps 1624 provided on electrode pads 1623 of a semiconductor chip 1620 are aligned with electrode pads 1626 provided on the transmission lines 1622 on the substrate 1621 using a camera (not shown) or the like. Thereafter, as shown in FIG. 19C, the semiconductor chip 1620 is pressurized by a pressure jig 1627. By this pressurization, the photocurable insulating resin 1625 is eliminated between the bumps 1624 and the electrode pads 1626, and the bumps 1624 are compressed to be deformed and stuck into the electrode pads 1626. Consequently, the bumps 1624 are electrically connected to the electrode pads 1626. Next, as shown in FIG. 19D, ultraviolet rays 1628 are irradiated onto the photocurable insulating resin 1625 so as to cure the resin, thereby fixing the substrate 1621 with the semiconductor chip 1620. At this time, since the photocurable insulating resin 1625 shrinks, connection between the electrode pads 1623 and the electrode pads 1626 is further strengthened. Subsequently, as shown in FIG. 19E, after the photocurable insulating resin 1625 is cured completely, the pressure jig 1627 is removed. In this manner, mounting of the semiconductor chip 1620 onto the substrate 1621 is completed.

By using such a MBB method, the bump 1624 with a thickness of about several $\mu$m or less can be obtained. As a result, parasitic inductance caused by the bumps 1624 can be suppressed to an extremely low level (i.e., an order of several picohenries (pH)), thereby obtaining a semiconductor device which can be satisfactorily used for a frequency in a millimeter wave band.

However, the high frequency transistors which are mounted using the flip chip mounting methods according to the conventional techniques as described above have the following problems.

First, the conventional high frequency transistor according to the Japanese Publication for Opposition No. 62-55721 described with reference to FIGS. 18A to 18C has problems as follows.

In FIG. 18C, in order to realize a stable and reliable mounting, it is necessary to equalize the height of the convex portion 1519 of the metal base 1515 with the heights of the lines 1517 and 1518 on the alumina substrates 1516 on the order of several $\mu$m. In actuality, however, realization of such a setting is extremely difficult. As a result, it is hard to guarantee a stable production yield.

In addition, in order to further reduce a source inductance, it is necessary to reduce the parasitic inductance caused by the bump 1511. For that purpose, the height of the bump 1511 may be shortened. In such a case, however, a gate-source capacitance Cgs and a drain-source capacitance Cds are increased. In other words, according to the aforementioned conventional technique, it is difficult to realize the reduction in the source inductance and the reduction in the parasitic capacitance at the same time. Therefore, there is a limit to the improvement in the high frequency characteristics of the resultant device.

Moreover, since the source electrode 1501 of the FET chip 1510 is formed in an isolated manner, it is practically impossible to perform a DC (direct current) testing of the FET in a wafer state. The "DC testing" herein refers to a testing procedure for examining operation characteristics of the FET chip (e.g., a saturated drain current, a drain-source breakdown voltage, and the like).

More specifically, in order to perform the DC testing of the FET in a wafer state, a probe head must be in contact with all of the source electrodes 1501. However, the diameter of a commonly-used probe head for the DC testing is greater than the width of the source electrode 1501 (i.e., W shown in FIG. 18A is from about 15 $\mu$m to about 30 $\mu$m). Therefore, it is impossible to allow the probe head for the testing to contact all of the source electrodes. Thus, DC testing in a wafer state cannot be conducted. As a result, according to the conventional technique described above, screening of the FET chips cannot be performed by the DC testing in a wafer state. Thus, it is hard to realize an improvement in the production yield of the high frequency semiconductor device.

On the other hand, according to the structure disclosed in Japanese Laid-open Publication No. 5-190563, since an emitter electrode is formed so as to cover a wide area of a base electrode with an interlayer insulating film interposed therebetween, it is hard to reduce the base-emitter capacitance Cbe. As a result, there is a limit to the improvement in the high frequency characteristics. Moreover, although this conventional technique requires a bump having a thick film made of Au to be formed, the formation step therefor requires a relatively long period of time. Furthermore, since the amount of Au used is increased, the production cost is also raised.

Moreover, if the conventional MBB mounting method described with reference to FIGS. 19A to 19E is applied, for example, to the structure of the conventional high frequency semiconductor device shown in FIG. 17 or that shown in FIGS. 18A to 18C, a gate electrode and a drain electrode of a GaAs chip face a metal base in the thus obtained semiconductor device. As a result, parasitic capacitance component in the gate-source capacitance Cgs or the drain-source capacitance Cds is increased, thereby causing an adverse effect on the high frequency characteristics. Moreover, the distance between the FET chip and the metal base is likely to be varied upon mounting, the aforementioned capacitances Cgs and Cds are also varied, thereby resulting in variations in the high frequency characteristics due to the change in impedance.

As described above, according to the conventional flip chip mounting techniques (including the MBB method), it is difficult to fabricate a high frequency semiconductor device having well-satisfactory high frequency operation characteristics with an excellent yield.

SUMMARY OF THE INVENTION

A high frequency semiconductor device of the present invention includes: a substrate having a substantially flat principal surface, with a predetermined circuit pattern including at least an input line, an output line, and a ground electrode provided on the principal surface; and a transistor which has a drain electrode, a source electrode, and a gate electrode and is mounted on the substrate by a flip chip mounting. The source electrode and the ground electrode are connected to each other by a first bump in the flip chip mounting.

In one embodiment, the transistor further includes: a source electrode pad which is electrically connected to the source electrode by a source extension line; and a gate electrode pad which is electrically connected to the gate electrode by a gate extension line. The width of the source extension line at an overlapped area of the source extension line and the gate extension line is smaller than the width of the source electrode.

Preferably, the ratio of the width of the source extension line at the overlapped area of the source extension line and the gate extension line to the width of the source electrode is about 0.5 or less.

In one embodiment, each of the drain electrode and the gate electrode has a first region opposing to the ground electrode and a second region not opposing to the ground electrode.

Alternatively, the transistor has a first region opposing to the ground electrode and a second region not opposing to the ground electrode; and at least one of the drain electrode and the gate electrode is formed only in the second region. Both of the drain electrode and the gate electrode may be formed only in the second region of the transistor. For example, the ground electrode may have a comb-shaped pattern or an island-shaped pattern. In one case, the length of the ground electrode may be equal to or less than the length of the source electrode.

In one embodiment, the ground electrode is formed in a band shape; the transistor further includes a source electrode pad which is electrically connected to the source electrode by a source extension line and a gate electrode pad which is electrically connected to the gate electrode by a gate extension line; and the width of the ground electrode is smaller than the distance between the drain extension line and the gate extension line.

In one embodiment, a through hole having a conductive pattern on an inside surface thereof for supplying a ground potential to the ground electrode is provided in the substrate; and the through hole is filled with a conductive material containing a metal as a main component thereof.

At least in a portion of a region opposing to the drain electrode or the source electrode in the ground electrode, a through hole having a conductive pattern on an inside surface thereof for supplying a ground potential to the ground electrode may be provided.

In one embodiment, the substrate is a (100) substrate; and the transistor is mounted on the substrate so that a longitudinal direction of the gate electrode is substantially parallel to a [010] direction or a [001] direction of the substrate.

In one embodiment, the first bump has a layered structure including a lower bump layer and an upper bump layer provided on the lower bump layer; and the hardness of the lower bump layer is different from the hardness of the upper bump layer.

Preferably, the ratio of Vickers hardness of the lower bump layer to Vickers hardness of the upper bump layer is about 3 or greater. For example, the lower bump layer may contain gold as a main component, and the upper bump layer may contain indium as a main component.

The first bump may have a cross section of a substantially n-sided shape (where n is an integer equal to or greater than 4).

In one embodiment, a plurality of the first bumps is are provided; and each of the plurality of the first bumps has substantially the same size.

The device may further include a second bump for electrically connecting at least one of the gate electrode and the drain electrode to the circuit pattern on the substrate.

Alternatively, a plurality of the first bumps and a plurality of the second bumps may be provided; and each of the plurality of the first bumps and the plurality of the second bumps may have substantially the same size.

The substrate may be a substrate containing aluminum nitride as a main component.

A plurality of the transistors may be included in the device.

Preferably, the flip chip mounting is performed by a microbump bonding method.

In one embodiment, a distance between the gate electrode and the first bump is about 25 $\mu$m or less. Furthermore, the first bump may be a microbump; and the distance between the gate electrode and the first bump may be about 10 $\mu$m or less.

A method for fabricating a high frequency semiconductor device according to the present invention includes the steps of: providing a predetermined circuit pattern at least including an input line, an output line, and a ground electrode on a substantially flat principal surface of a substrate; applying a resist with a predetermined pattern to the principal surface of the substrate including the circuit pattern; performing a flip chip mounting of a semiconductor chip on the principal surface of the substrate by utilizing photocurable insulating resin; and removing the resist so as to remove a portion of the photocurable insulating resin which exists on the resist.

A source electrode included in the semiconductor chip may be electrically connected to the ground electrode via a bump in the step of performing the flip chip mounting.

Preferably, the source electrode is electrically connected to the ground electrode by using a microbump method in the step of performing the flip chip mounting.

The substrate may be a substrate containing aluminum nitride as a main component.

Thus, the invention described herein makes possible the advantages of (1) providing a high frequency semiconductor device having such excellent operation characteristics as a low source inductance, a low parasitic capacitance, and a high heat releasing property, which can be fabricated with an excellent yield; and (2) providing a method for fabricating a high frequency semiconductor device, which can produce the high frequency semiconductor device having such characteristics.

These and other advantages of the present invention will become apparent to those skilled in the art upon reading and understanding the following detailed description with reference to the accompanying figures.

DESCRIPTION OF THE PREFERRED EMBODIMENTS

Figure 1A:
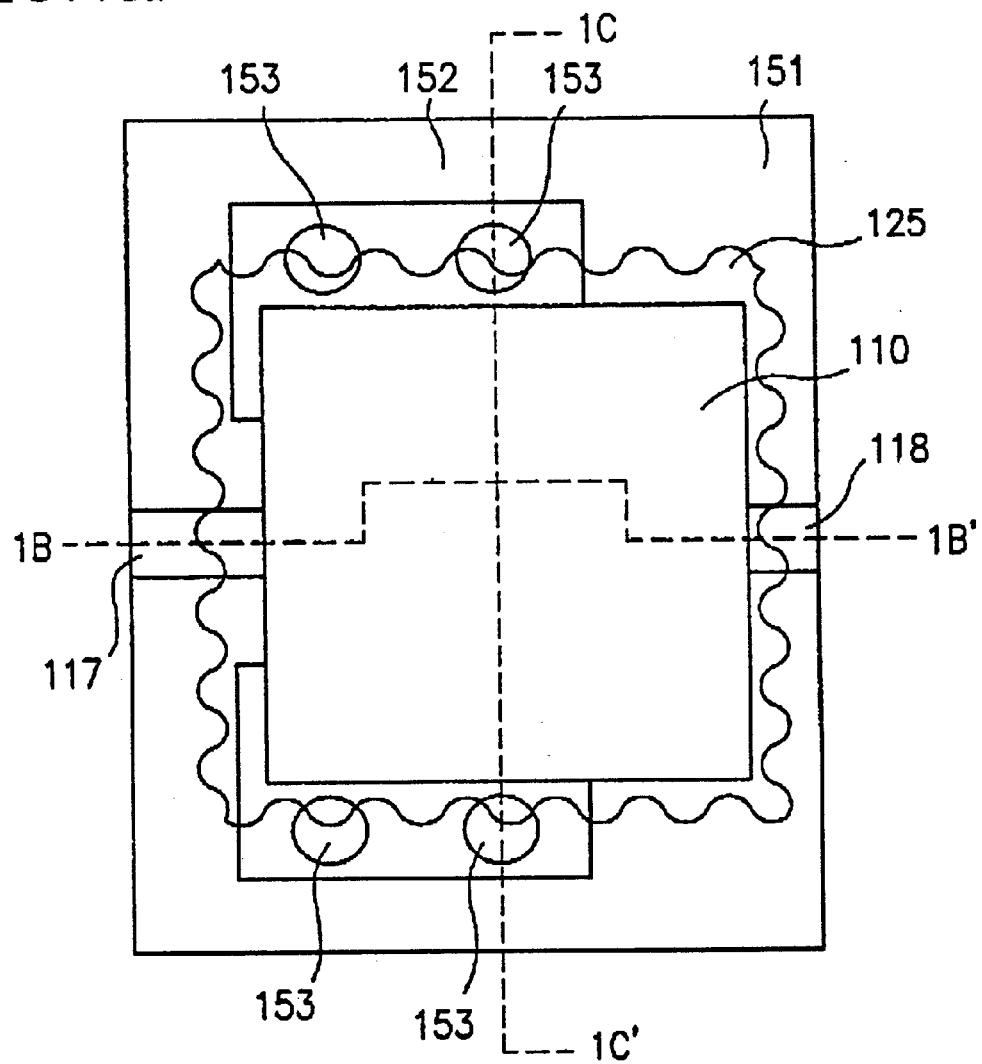
FIG. 1A is a plan view illustrating a high frequency semiconductor device according to Embodiment 1 of the present invention.

Hereinafter, a high frequency semiconductor device according to the present invention will be described by way of illustrative, but non-limiting examples with reference to the accompanying drawings. In the following description, the same components are denoted by the same reference numerals and duplicating description may be omitted.

In this specification, the "length" of each of the electrodes (i.e., a drain electrode, a source electrode, a gate electrode, and a ground electrode) is measured along a direction parallel to the longitudinal direction of the electrode. The "width" of each of the electrodes is measured along a direction perpendicular to the longitudinal direction of the electrode. The "width" of each of extension lines is measured along a direction perpendicular to the longitudinal direction of the line.

Although the "FET chip" herein refers mainly to a chip used for power amplification in a frequency band equal to, in the vicinity of, or higher than the gigahertz band, the frequency and purpose of a FET chip to which the present invention can be applied are not limited thereto.

Embodiment 1

Figure 1B:
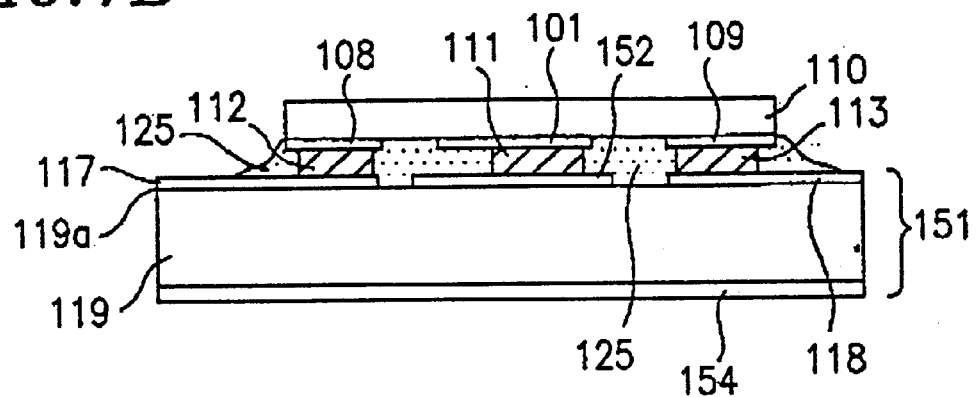
FIG. 1B is a cross-sectional view of the high frequency semiconductor device taken along line 1B–1B' in FIG. 1A.
Figure 1C:
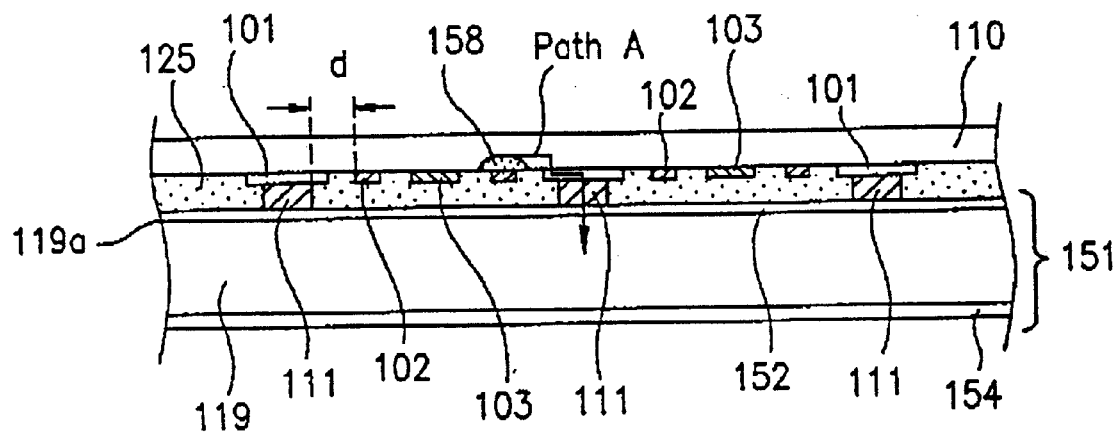
FIG. 1C is a cross-sectional view of the high frequency semiconductor device taken along line 1C–1C' in FIG. 1A.

FIG. 1A is a plan view showing a high frequency semiconductor device according to Embodiment 1 of the present invention. FIG. 1B is a cross-sectional view showing the high frequency semiconductor device taken along line 1B–1B' in FIG. 1A. FIG. 1C is a view illustrating a central area of the cross section taken along line 1C–1C' in FIG. 1A.

A GaAs FET chip 110 used for amplification of a high frequency power signal is mounted on a flip chip mounting substrate 151 (hereinafter, simply referred to as a "substrate") containing aluminum nitride as a main component using the MBB method.

In FIG. 1B, a source electrode 101, a gate electrode pad 108 and a drain electrode pad 109 are provided on a surface facing the substrate 151 of the GaAs FET chip 110.

The substrate 151, on the other hand, includes a plate 119 made of aluminum nitride as a core member. The substrate having such a structure is also referred to as a "substrate containing aluminum nitride as a main component" in this specification. The substrate 151 includes a ground electrode 152, an input line 117, and an output line 118 provided on a surface 119a thereof opposing to the GaAs FET chip 110 (hereinafter, referred to as a "principal surface 119a"). A ground terminal 154 is provided on a surface opposite to the principal surface 119a (hereinafter, referred to as a "back surface"). The principal surface 119a of the substrate 151 is substantially flat without having the convex portion found in the conventional technique shown in FIG. 17.

Photocurable insulating resin 125 fills a space between the GaAs FET chip 110 and the substrate 151 and its peripheral regions. The photocurable insulating resin 125 is cured by irradiation of ultraviolet rays so as to fix the GaAs FET chip 110 with the substrate 151.

The substrate 151 includes a plurality of through holes 153 extending from the principal surface 119a thereof through the back surface thereof. Inside surfaces of the through holes 153 are metallized so as to provide electrical connection between a circuit pattern provided on the principal surface 119a of the substrate 151 and a circuit pattern provided on the back surface of the substrate 151 (e.g., between the ground electrode 152 and the ground terminal 154). Bumps 111, 112, and 113 electrically connect the source electrode 101, the gate electrode pad 108, and the drain electrode pad 109 with the ground electrode 152, the input line 117, and the output line 118, respectively.

The substrate 151 is fabricated, for example, in the following manner.

Figure 2:
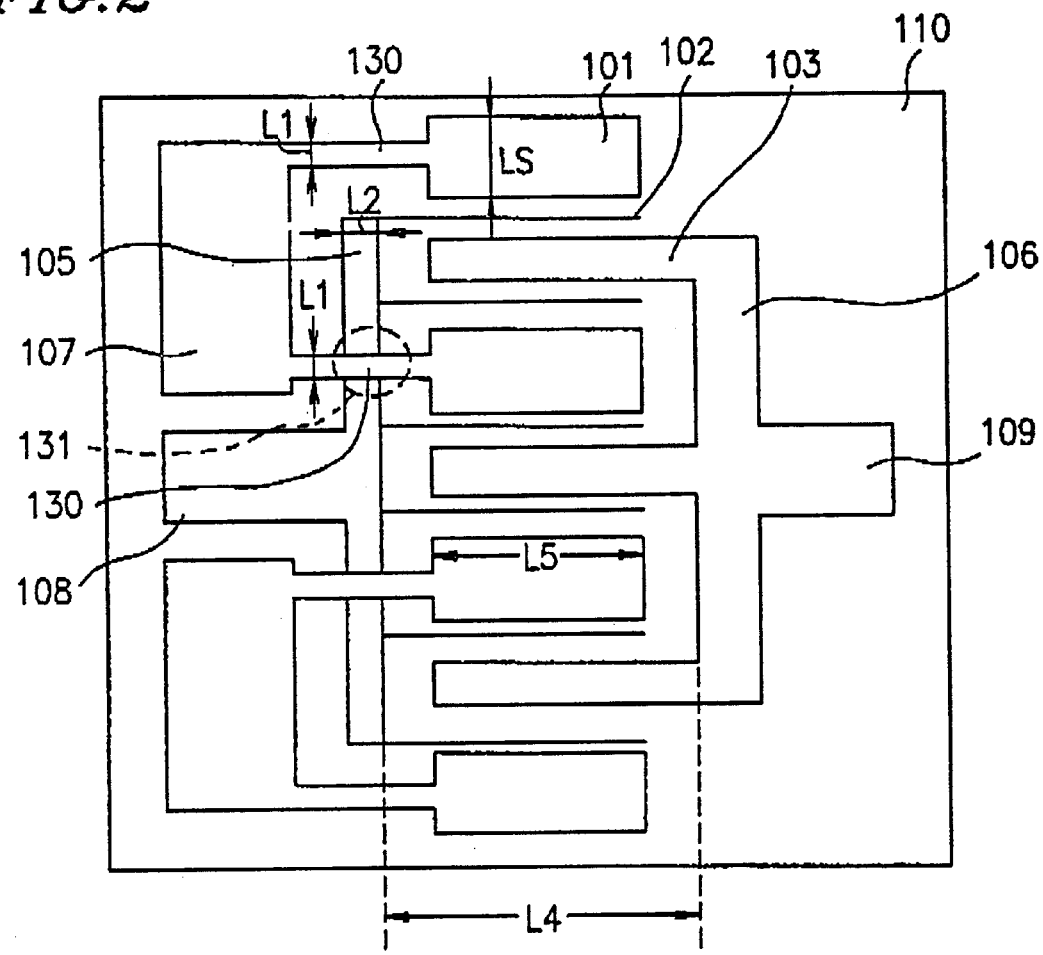
FIG. 2 is a general view illustrating the structure of a FET chip which can be included in a high frequency semiconductor device according to the present invention.

First, after forming the through holes 153 through a plate 119 made of aluminum nitride, the resultant substrate is sintered at a high temperature. Next, metal thin films (e.g., Cu films) are formed on the surface of the substrate 151 and the inside surfaces of the through holes 153 by sputtering or the like. Subsequently, Au films with a thickness of about 3 $\mu$m are plated on the thus formed metal thin films. Thereafter, a metal pattern is formed on the surface of the substrate 151 by photolithography, and Au-plating treatment is further conducted on the metal pattern. Finally, the gold bump 111 with a height of about 10 $\mu$m is formed at a predetermined position on the metal pattern, FIG. 2 is a schematic view illustrating the structure of the GaAs FET chip 110.

The GaAs FET chip 110 includes the source electrode 101, the gate electrode 102, and the drain electrode 103. The GaAs FET chip 110 further includes the source electrode pad 107, the gate electrode pad 108, and the drain electrode pad 109 for allowing the conduct of the DC testing in a wafer state. In such a structure, six of the unit FETs in total are included as in the conventional structure described with reference to FIG. 17.

Parameters of the gate electrode 102 in the GaAs FET chip 110 are, for example:

finger length=about 50 $\mu$m, the number of fingers=6, and total gate length=about 300 $\mu$m.

The source extension line 130, the gate extension line 105, and the drain extension line 106 electrically connect the source electrode 101, the gate electrode 102, and the drain electrode 103 to the source electrode pad 107, the gate electrode pad 108, and the drain electrode pad 109, respectively. Herein, the source electrode 101 is connected to the source electrode pad 107 having a larger area than the area thereof by the source extension line 130. Therefore, it becomes possible to perform the DC testing in a wafer state.

More specifically, the diameter of the probe used for the DC testing is generally, for example, on the order of about 30 $\mu$m, while the width LS of the source electrode 101 is generally on the order of about 15 $\mu$m to about 30 $\mu$m; these are substantially on the same order. Therefore, it is difficult to make the probe for the DC testing directly into contact with the source electrode 101. However, when the source electrode pad 107 on the order of about 50 $\mu$m×about 50 $\mu$m as described above, for example, is provided, the DC testing can be performed in a wafer state by bringing the source electrode pad 107 into contact with the probe.

In this manner, according to the present invention, it is possible to obtain a high frequency semiconductor device employing the flip chip mounting in which the FET chip 110 is connected to the substantially flat principal surface 119$a$ of the substrate 151 such that the source electrode 101 thereof is connected to the ground electrode 152 on the substrate 151 via the bump 111 by the microbump bonding (MBB) method. Herein, the bump 111 to be used in the MBB method (also referred to as "microbump") and the ground electrode 152 are not firmly joined by alloying or the like. Rather, the bump 111 and the ground electrode 152 are electrically connected to each other in a state where they are mechanically compressed. The inventors of the present application paid attention to the fact that the bump (microbump) 111 can slightly move in a lateral direction on the surface of the ground electrode 152 even after mounting (i.e., after connection) if the characteristics of the MBB method as described above are utilized.

Moreover, by providing the source electrode pad having a suitable size as described above, it becomes possible to perform the DC testing while the FET chip is in a wafer state. With such a structure, the problems related to the flip chip mounting techniques according to the aforementioned conventional methods (including the MBB method) are overcome.

Furthermore, according to the present embodiment as shown in FIG. 2, the width L1 of the source extension line 130 is set to be smaller than the width LS of the source electrode 101 at least at an overlapped area 131 with the gate extension line 105. In this respect, the GaAs FET chip 110 according to the present invention differs from the conventional FET chip shown in FIG. 17. More specifically, according to the present embodiment, the ratio of the width L1 of the source extension line 130 at the overlapped area 131 to the width LS of the source electrode 101 is about L1/LS=0.1 (=about 3.0 $\mu$m/about 30 $\mu$m).

Hereinafter, directing attention to the overlapped area 131, the relationship between the width L1 of the source extension line 130 and the gate-source capacitance Cgs1 (i.e., parasitic capacitance) will be considered.

The source extension line 130 is provided on the gate extension line 105 via an interlayer insulating film (not shown). Due to the crossing of the lines, the parasitic capacitance Cgs1 is generated therebetween. Suppose that the structure according to the present embodiment shown in FIG. 2 has parameters as described below:

width L1 of the source extension line 130=about 3.0 $\mu$m;

width L2 of the gate extension line 105=about 10 $\mu$m;

thickness d of the interlayer insulating film=about 0.45 $\mu$m;

dielectric constant of the interlayer insulating film $\epsilon r$=about 8.0; and the number of the overlapped areas 131=2.

In such a case, the parasitic capacitance Cgs1=0.01 pF is obtained. On the other hand, in the case of the conventional FET shown in FIG. 17 where the width of the source extension line 1404 equals the width of the source electrode 1401 (i.e., about 30 $\mu$m), if the other parameters are the same as those described above, the parasitic capacitance Cgs1 is about 0.10 pF. In other words, according to the structure of this embodiment, the value of the parasitic capacitance Cgs1 can be suppressed to a level of about 1/10 of that in the conventional example.

A gate-source capacitance Cgs of the GaAs FET chip 110 viewed from an external circuit is given by the sum of a gate-source capacitance Cgs0 in a channel region of the GaAs FET chip 110 and the parasitic capacitance Cgs1 as described above, i.e., Cgs=Cgs0+Cgs1.

Accordingly, if Cgs0=about 0.15 pF, in the case of the conventional high frequency semiconductor device in which the width of the source extension line 1404 equals the width of the source electrode 1401 (i.e., about 30 $\mu$m), the following relationship is satisfied:

Cgs=Cgs0+Cgs1=about 0.15 pF+about 0.10 pF=about 0.25 pF.

On the other hand, according to the present embodiment, the following relationship is satisfied:

Cgs=Cgs0+Cgs1=about 0.15 pF+about 0.01 pF=about 0.16 pF.

Thus, the gate-source capacitance Cgs is reduced to a level of about 64% of that in the conventional example.

In general, a maximum cutoff frequency Ft of the FET is given in a simplified manner using a mutual conductance gm and a gate-source capacitance Cgs, i.e., $Ft = gm \times (2\pi)^{-1} \times (Cgs)^{-1/2}$.

Therefore, as described above, in accordance with the present embodiment, by reducing the width L1 of the source extension line 130 to about 3.0 µm from about 30 µm in the conventional example, the gate-source capacitance Cgs is reduced to a level of about 64% of that in the conventional example. The maximum cutoff frequency Ft, in turn, is improved to a level of about 1.25 times the value in the conventional example.

Furthermore, a reduction in the width of the gate extension line 105 allows the parasitic capacitance Cgs1 to be reduced. In such a case, however, the gate resistance is increased, thereby deteriorating the high frequency characteristics of the thus obtained FET. On the other hand, even when the width of the source extension line 130 is reduced as in the present embodiment, since the source electrode 101 is connected to the ground terminal on the substrate opposing thereto by flip chip bonding, the high frequency characteristics of the FET are not deteriorated. Accordingly, as in the present embodiment, for example, if the width L1 of the source extension line 130 is set to be about 3.0 µm, the DC testing in a wafer state of the FET can be satisfactorily conducted without causing adverse effects on the high frequency characteristics.

Figure 17:
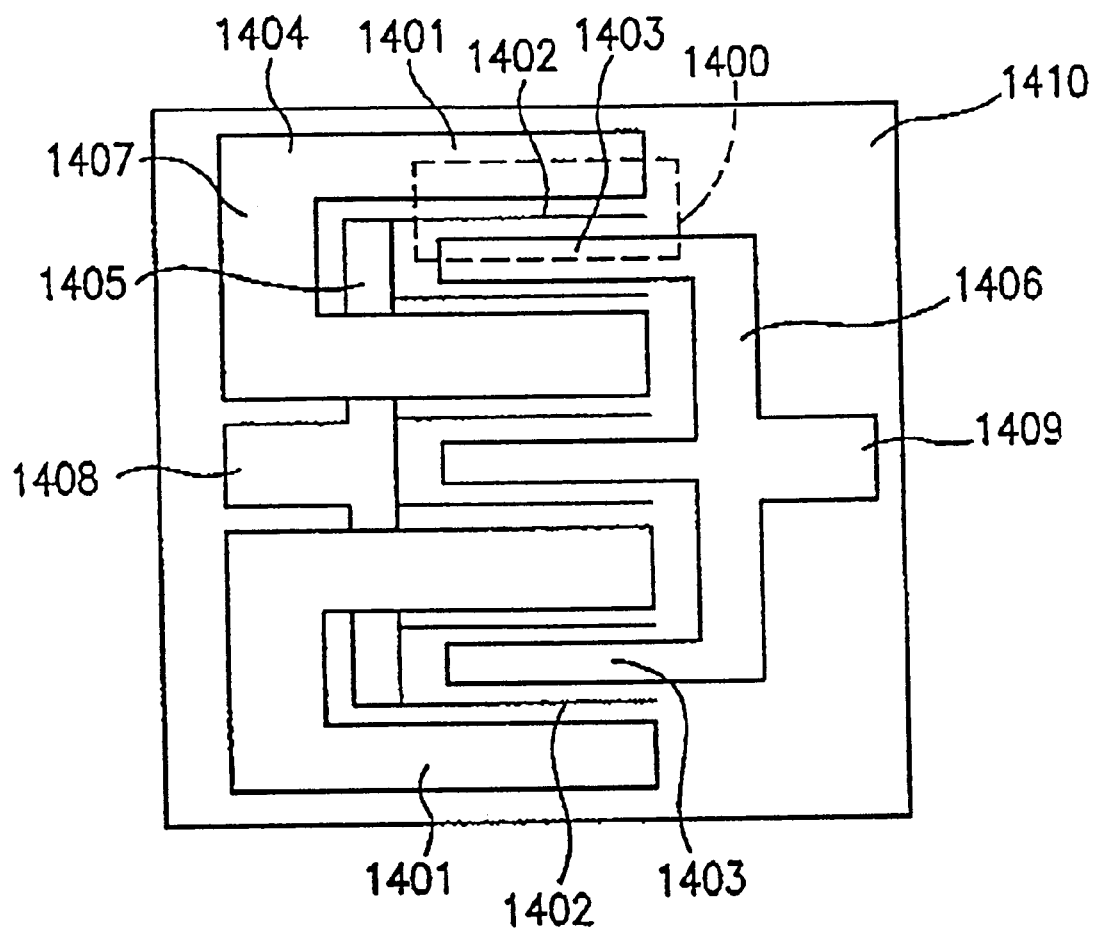
FIG. 17 is a plan view schematically showing a conventional high frequency power FET chip.
Figure 18A:
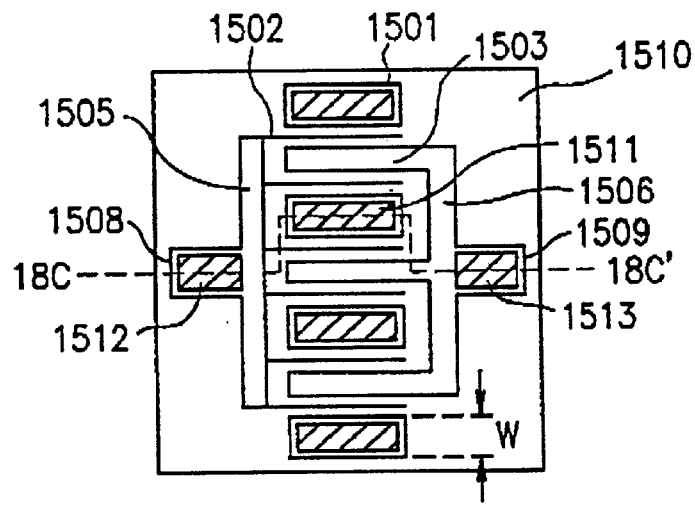
FIG. 18A is a plan view showing the electrode configuration of another conventional high frequency FET chip.
Figure 18B:
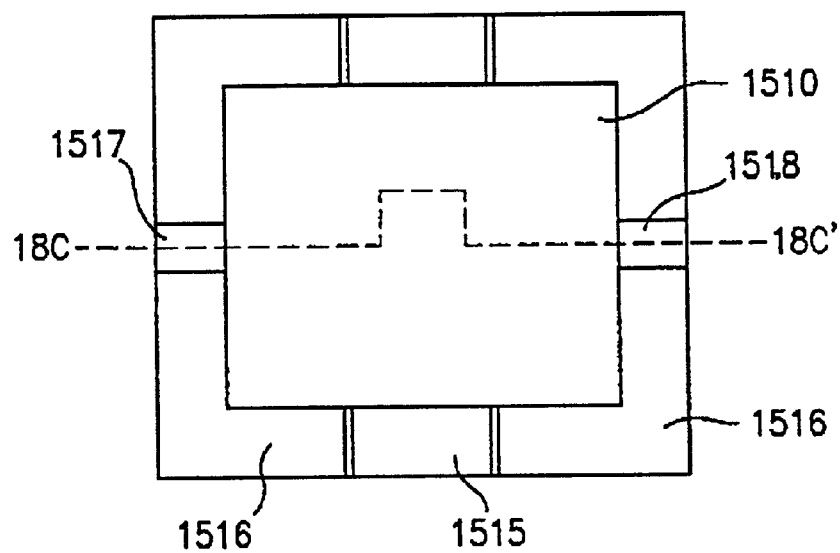
FIG. 18 is a plan view showing a package into which the FET chip shown in FIG. 18A is mounted using a flip chip mounting method.
FIG. 18C is a cross-sectional view showing the cross section taken along line 18C–18C' in FIGS. 18A and 18B.
Figure 18C:
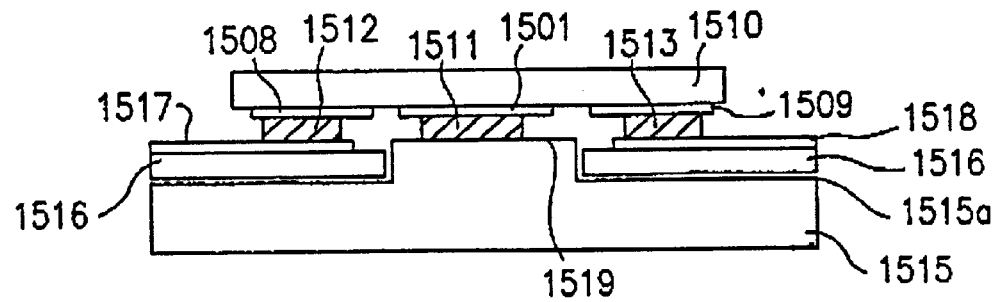
Figure 19A:
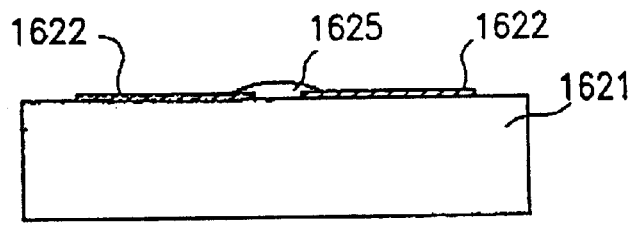
FIGS. 19A to 19E are cross-sectional views sequentially showing steps for fabricating a semiconductor device using a conventional MBB method.
Figure 19B:
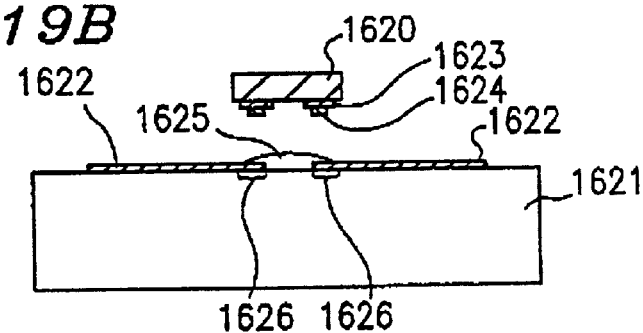
Figure 19C:
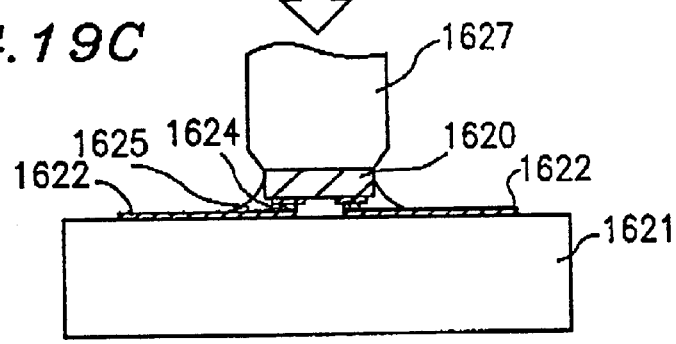
Figure 19D:
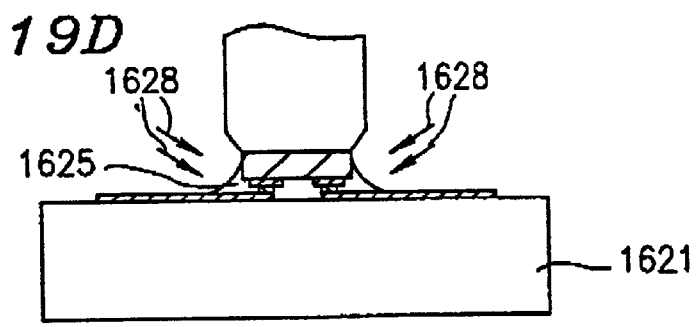
Figure 19E:
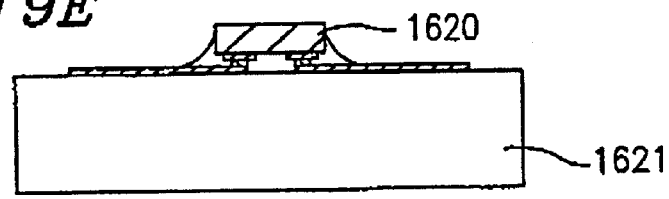

In the high frequency FET which is mounted using a bonding wire according to the conventional technique as shown in FIG. 17, the width of the source electrode 1401 and the width of the source extension line 1404 are substantially the same. This is because a reduced width of the source extension line 1404 in the conventional technique using the bonding wire leads to deterioration in the high frequency characteristics due to the increase in the source resistance. Moreover, according to the conventional technique, in order to reduce the capacitance Cgs without increasing the source resistance, an air bridge may be employed as the source extension line. However, such a method employing the air bridge has problems such as (1) the increased number of fabrication steps and (2) destruction of the air bridge upon mounting by the MBB method, caused by a reduced distance between the FET chip and the mounting substrate which is several µm or less.

On the other hand, according to the present embodiment, the width of the source extension line for connecting the source electrode and the source electrode pad of the high frequency FET is set to be smaller than the width of the source electrode in the high frequency semiconductor device which is fabricated using the flip flop mounting. Consequently, it becomes possible to perform the DC testing of the FET chip in a wafer state without sacrificing the high frequency characteristics.

If the source extension line 130 is made too thin, the operation of the FET is adversely affected due to an increase in resistance component. According to the study made by the inventors of the present application, in order to avoid such an adverse effect, the width of the source extension line 130 is preferably about 1.0 µm or greater.

On the other hand, in order to obtain the effect of improving the maximum cutoff frequency Ft of the FET, a ratio of the width L1 of the source extension line 130 at the overlapped area 131 to the width LS of the source electrode 105 is preferably L1/LS=about 0.5 or less. For example, in the case where L1/LS is about 0.5 in the structure having the aforementioned parameters, L1 becomes about 15 µm. At this time, the gate-source capacitance Cgs is about 0.20 pF. More specifically, although the gate-source capacitance Cgs0 in the channel region remains the same, i.e., Cgs0= about 0.15 pF, the parasitic capacitance Cgs1 which is proportional to the line width becomes about 0.05 pF. As a result, the gate-source capacitance Cgs is reduced to a level of about 80% of the value in the conventional example. In this case, the maximum cutoff frequency Ft of the FET is a value about 1.1 times that in the conventional example. If the aforementioned ratio, L1/LS, exceeds about 0.5, significant improvement in the gate-source parasitic capacitance Cgs1 cannot be observed. As a result, the obtained maximum cutoff frequency Ft of the FET is a value less than the value about 1.1 times as that in the conventional example. Thus, the effect of improving the maximum cutoff frequency Ft of the FET cannot be substantially recognized.

For the reasons described above, the width L1 of the source extension line 130 is preferably such a value that the ratio of the width L1 of the source extension line 130 at the overlapped area 131 to the width LS of the source electrode 105 is about 0.5 or less and its absolute value is about 1.0 µm or greater.

Although the width of the source extension line 130 is uniform in FIG. 2, the width thereof is not limited thereto. For example, even when the source extension line 130 has a narrow width only in the vicinity of the overlapped area 131 with the gate extension line 105, the same effect as that described above can be obtained. Rather, it is more preferable that the source extension line 130 has such a variable width since an increase in the resistance of the source extension line 130 can be suppressed while reducing the gate-source parasitic capacitance Cgs1.

Referring to FIG. 1C again, setting of the distance between the gate electrode 102 and the bump 111 will be described hereinafter.

In the flip chip mounting of a FET chip for a power amplifier, it is important to assure heat release from the FET chip. In general, heat in the FET is generated in the region 158 (see FIG. 1C) immediately below the gate electrode 102. According to the structure of the present invention, heat generated in the region 158 is transferred to the substrate 151 via a path A shown in FIG. 1C. Therefore, in order to reduce heat resistance along the path A so as to assure satisfactory heat release along the path A, it is necessary to reduce the distance d from the gate electrode 102 to the bump 111.

Figure 1D:
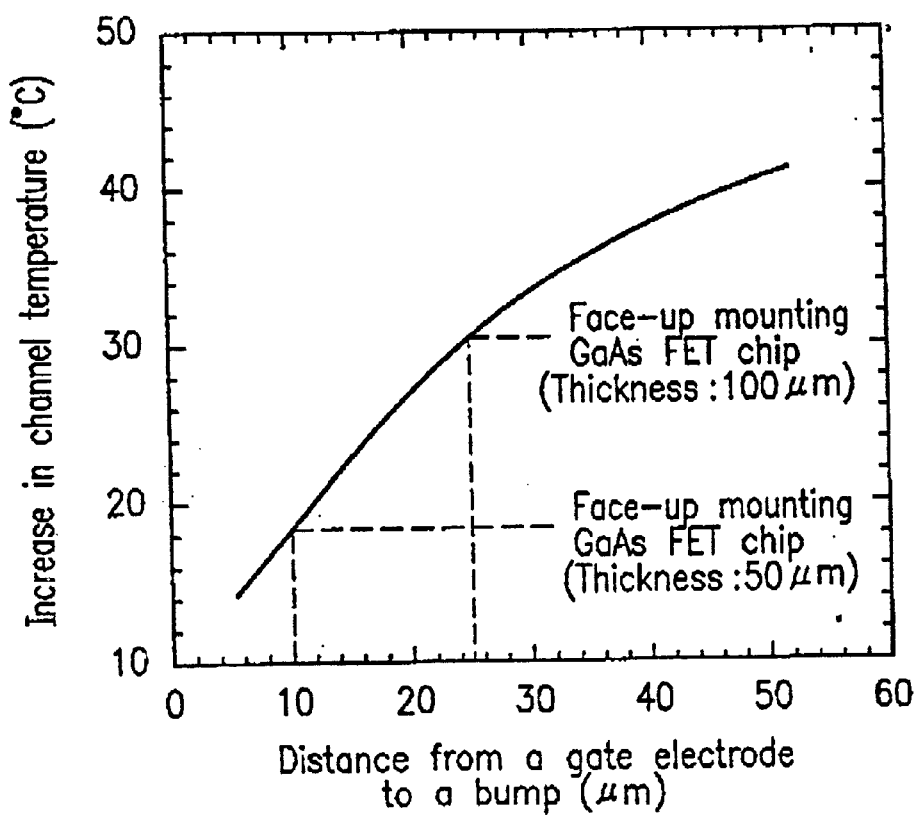
FIG. 1D is a graph showing calculation results regarding the relationship between a distance d from a gate electrode to a bump and an increase in temperature $\Delta T$ of a region immediately below the gate electrode (i.e., channel temperature)

FIG. 1D is a graph showing calculation results regarding the relationship between the distance d from the gate electrode 102 to the bump 111 as described above and an increase in temperature ΔT of the region 158 immediately below the gate electrode 101 (i.e., channel temperature). Herein, it is supposed that in the region 158, there is a heating of 1 W per a length of 1 mm in the longitudinal direction of the gate electrode 101.

As can be seen from FIG. 1D, the increase in channel temperature, ΔT, can be suppressed to be about 31° C. or lower by setting the distance d to be about 25 µm or less. This is the same level as the increase in temperature obtained in a face-up mounting of a GaAs FET chip (i.e., in the mounting where the principal surface of the chip faces up) with a thickness of about 100 µm under the same heating condition. The face-up mounting of the GaAs FET chip with a thickness of about 100 µm is a commonly-often-used mounting for a power FET. Therefore, having the same level of heating condition as described above indicates that the high frequency semiconductor device of the present invention can be used for handling a high power by setting the distance d from the gate electrode 102 to the bump 111 in its structure to be about 25 µm or less.

Furthermore, as can be seen from the graph of FIG. 1D, the increase in channel temperature ΔT can be suppressed to be about 18° C. or lower by setting the aforementioned distance d to be about 10 μm or less. This is the same level as the increase in temperature obtained in the case where the GaAs FET chip, which had been ground so as to have a thin thickness of about 50 μm, is mounted in a face-up manner under the same heating condition. The grinding of the GaAs FET chip for obtaining a thickness of about 50 μm as described above has been conventionally required in order to realize a power amplifier capable of handling a high output of several 10W or more. In general, however, such a power amplifier is hard to be realized due to its difficult handling, thereby decreasing its production yield, or the like. According to the present invention, on the other hand, by setting the distance d from the gate electrode 102 to the bump 111 in the structure thereof to be about 10 μm or less, it becomes possible to obtain the power amplifier capable of handling a high output of several 10 W or more without performing the grinding step as described above.

In the case where the above-described distance d is small, the influence of stress which can be generated due to a difference in coefficients of thermal expansion between the GaAs FET chip 110 and the substrate 151 must be considered.

In the case where the bump 111 and the ground electrode 152 are firmly joined by the Au—Sn junction or the like according to the conventional technique, the stress generated due to the aforementioned reason is applied to the vicinity of the gate electrode 102 provided adjacent to the bump 111. As a result, the electrical characteristics or reliability of the FET (high frequency power amplifier device) can be deteriorated.

On the other hand, if the bump 111 and the ground electrode 152 are connected to each other by the MBB mounting as in the present invention, the bump 111 can slightly move in a lateral direction on the ground electrode 152 while securely maintaining the electrical connection therebetween. As a result, even when the GaAs FET chip 110 and the substrate 151 have different levels of heat expansion, the stress accompanying such heat expansion is absorbed due to the positional displacement of the bump (microbump) 111. Thus, the adverse effect of the stress caused by the difference in coefficients of heat expansions between the GaAs FET chip 110 and the substrate 151 does not occur.

Accordingly, by employing the MBB mounting, even when the distance d from the gate electrode 102 to the bump 111 is set to be about 10 μm or less, adverse effects accompanying such a setting on the electrical operation characteristics or reliability of the high frequency power amplifier (FET) are not caused.

Moreover, in the face-up mounting, it is generally difficult to further reduce the thickness of the GaAs FET chip to a level of less than about 50 μm. As a result, there is a limit to the reduction in heat resistance. According to the present invention, on the other hand, by setting the distance d from the gate electrode 102 to the bump 111 to be about 10 μm or less as described above, a level of reduction in heat resistance which cannot be obtained in the conventional technique is obtained.

As described above, according to the high frequency semiconductor device of the present invention, by setting the distance d from the gate electrode 102 to the bump 111 to be about 25 μm or less, the semiconductor device can be used for power purposes such as a power amplifier. Moreover, by setting the aforementioned distance d to be about 10 μm or less by utilizing the MBB mounting, a high output power amplifier which can handle a power exceeding several 10W can be realized.

Embodiment 2

Figure 3A:
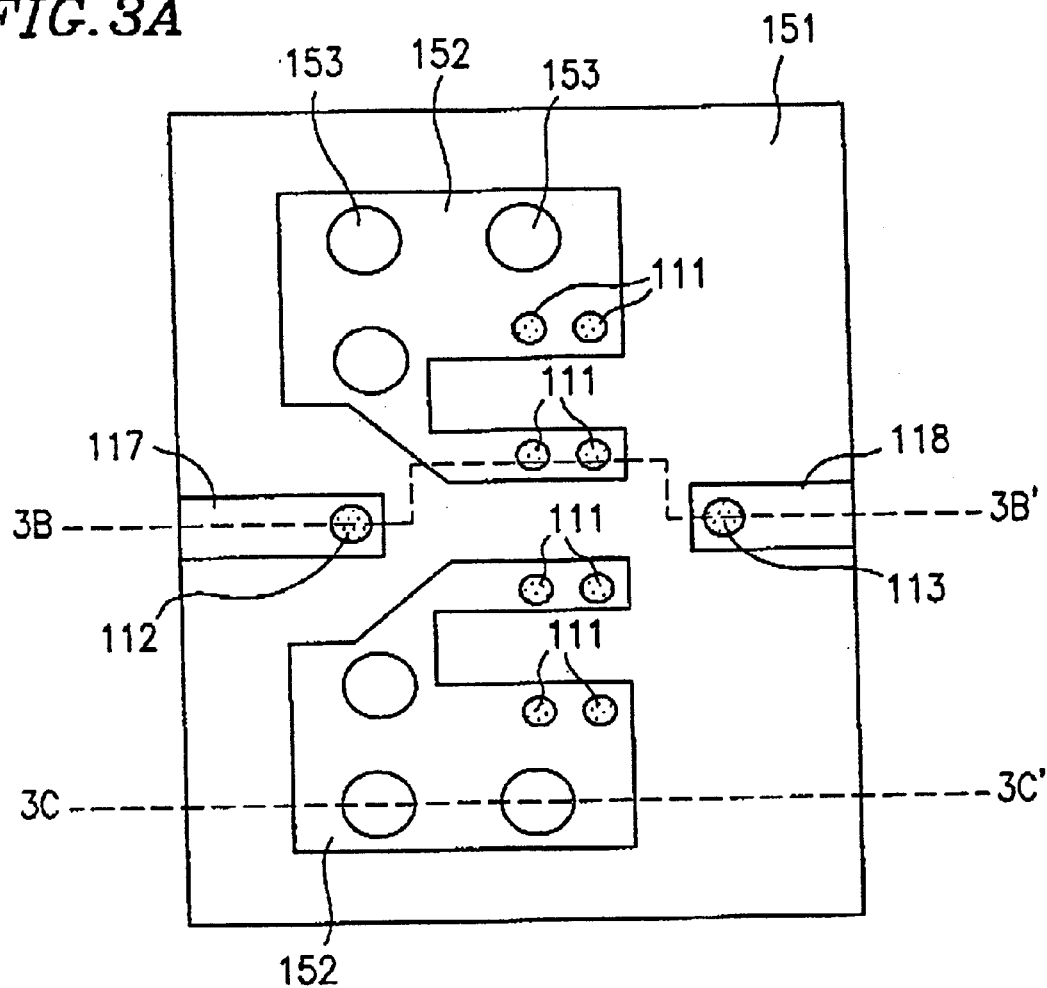
FIG. 3A is a plan view showing a flip chip mounting substrate to be included in a high frequency semiconductor device according to Embodiment 2 of the present invention.
Figure 3B:
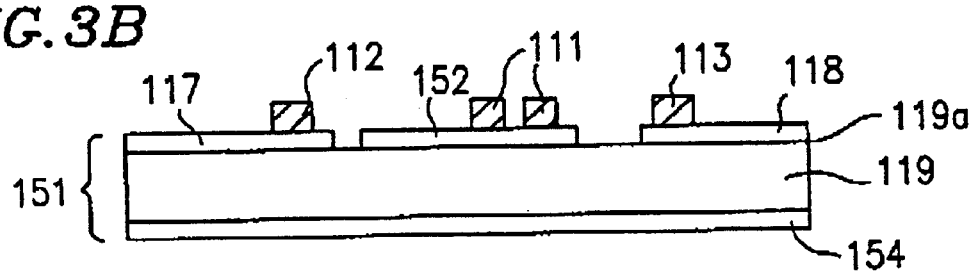
FIG. 3B is a cross-sectional view showing the flip chip mounting substrate taken along line 3B–3B' in FIG. 3A.
Figure 3C:
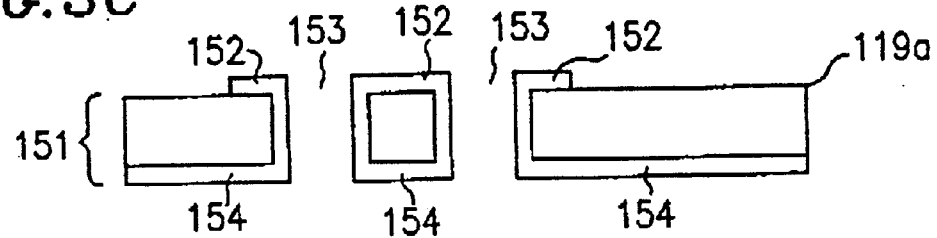
FIG. 3C is a cross-sectional view showing the flip chip mounting substrate taken along line 3C–3C' in FIG. 3A.

FIG. 3A is a plan view showing a flip chip mounting substrate 151 included in a high frequency semiconductor device according to Embodiment 2 of the present invention. FIGS. 3B and 3C are cross sectional views of the flip chip mounting substrate 151 taken along lines 3B–3B' and 3C–3C' in FIG. 3A, respectively.

The substrate 151 containing aluminum nitride as a main component includes a ground electrode 152, an input line 117, and an output line 118 provided on a principal surface 119a thereof which is a substantially flat surface. A plurality of through holes 153 are provided in the ground electrode 152. Side surfaces of the through holes 153 are metallized so as to electrically connect the ground electrode 152 provided on the principal surface 119a of the substrate 151 with a ground terminal 154 provided on the back surface of the substrate 151. In FIG. 3C, for convenience, the conductive film provided on the side surfaces of the through holes 153 by metallizing treatment, the ground electrode 152 and the ground terminal 154 are shown in a continuous manner. The same thing applies to the other similar drawings of this specification.

Bumps 111, 112, and 113 are provided on the ground electrode 152, the input line 117, and the output line 118, respectively. As shown in the previously referred FIG. 1B, upon performing the flip chip mounting, the bumps 111, 112, and 113 connect the source electrode 101, the gate electrode pad 108, and the drain electrode pad 109 of the FET chip 110 with the ground electrode 152, the input line 117, and the output line 118, respectively.

Also in Embodiment 2, the GaAs FET chip 110 shown in FIG. 2 is used as a GaAs FET chip to be mounted by the flip chip mounting method. According to Embodiment 2, however, the characteristics that "the width of the source extension line is smaller than the width of the source electrode" described in Embodiment 1 may not be necessarily satisfied.

Figure 4:
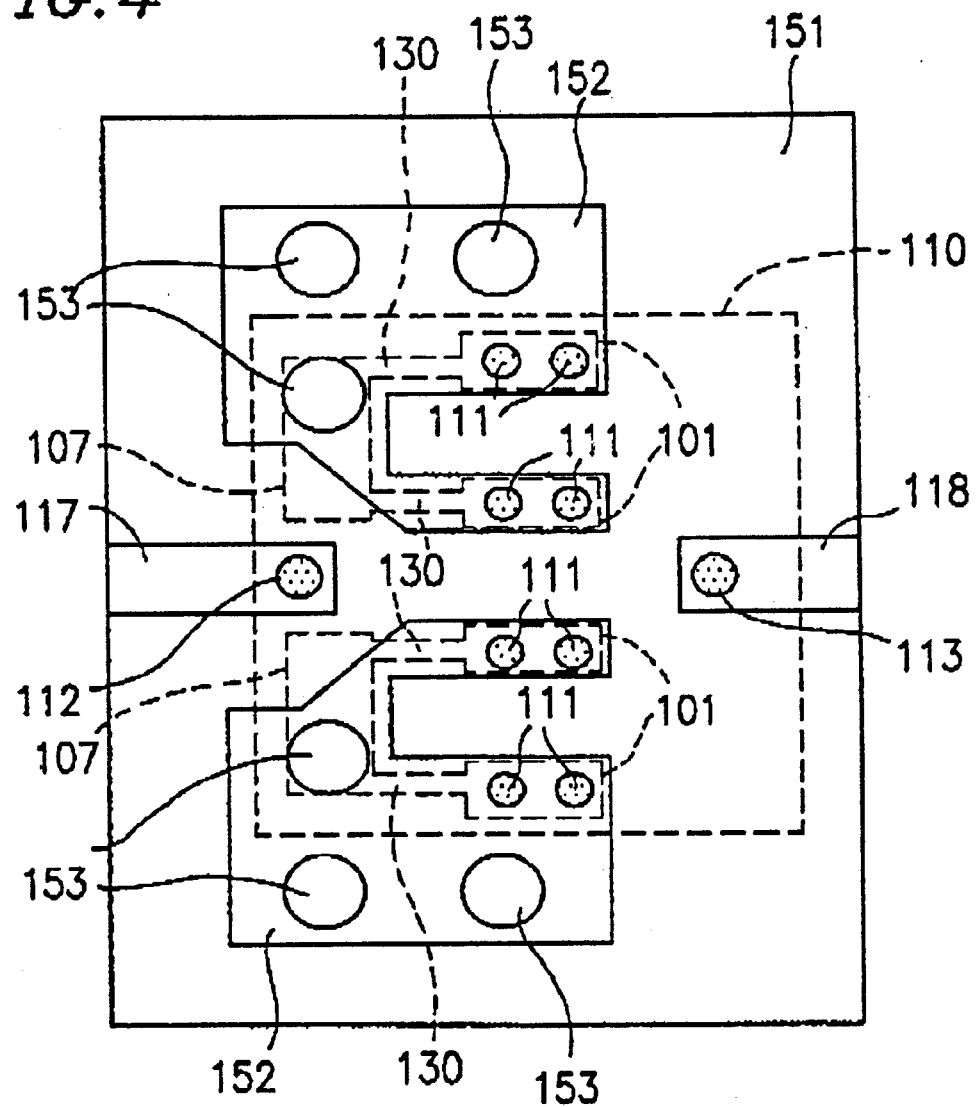
FIG. 4 is a plan view showing the positional relationship between a source electrode and a ground electrode in the high frequency semiconductor device according to Embodiment 2 of the present invention.
Figure 5:
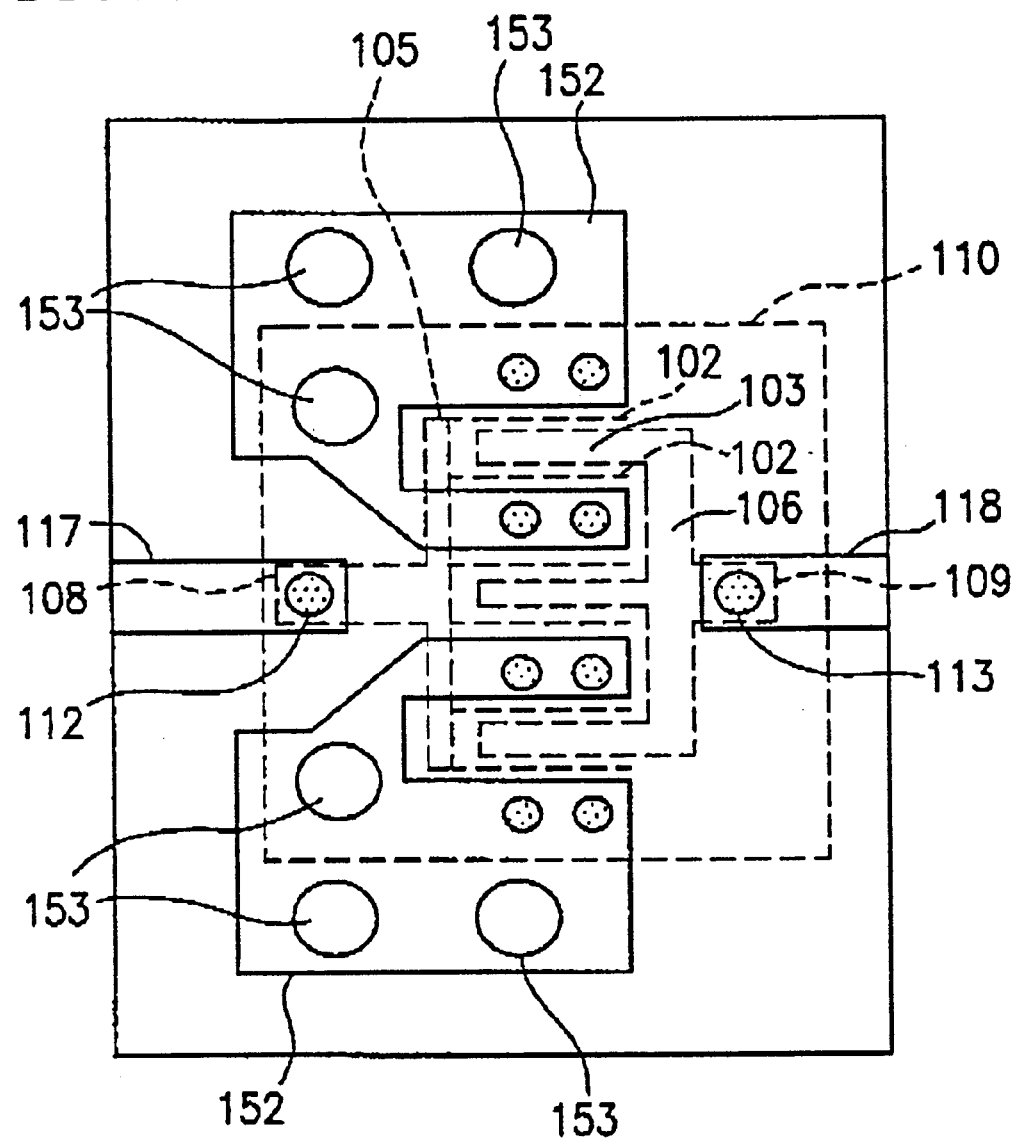
FIG. 5 is a plan view showing the positional relationship between gate/drain electrodes, and a ground electrode in the high frequency semiconductor device according to Embodiment 2 of the present invention.

FIG. 4 is a plan view showing the positional relationship between the source electrode 101 and the ground electrode 152 according to Embodiment 2 of the present invention, and FIG. 5 is a plan view showing the positional relationship between the gate and drain electrodes 102 and 103 and the ground electrode 152 according to Embodiment 2 of the present invention.

In the substrate 151 according to this embodiment, the ground electrode 152 is formed to have a comb-shape. More specifically, the pattern of the ground electrode 152 is designed such that the ground electrode 152 exists in a region opposing to the source electrode 101 of the GaAs FET chip 110 which is mounted using the flip chip mounting method (see FIG. 4), but not in a region opposing to the gate electrode 102 and the drain electrode 103 (see FIG. 5). In other words, the gate electrode 102 and the drain electrode 103 substantially have no region opposing to the ground electrode 152.

By using such a substrate 151 according to the present embodiment, parasitic capacitances between the GaAs FET chip 110 and the substrate 151 (i.e., a gate-source capacitance Cgs2 and a drain-source capacitance Cds2) can be made negligibly small. As a result, operation characteristics of the resultant high frequency semiconductor device can be improved. By employing aluminum nitride having a high heat conductivity as a main component of the substrate 151, heat generated in the GaAs FET chip 110 is allowed to efficiently escape to a heat sink (not shown) to be connected to the ground terminal 154.

Even if parts of the gate electrode 102 and the drain electrode 103 face the ground electrode 152, or even if only parts of the gate electrode, 102 and the drain electrode 103 are not opposed to the ground electrode 152, the same effect as that described above can be obtained to some extent. For obtaining the better effect, however, it is more preferable to have a structure in which the gate electrode 102 and the drain electrode 103 substantially have no region which is formed so as to face the ground electrode 152.

Hereinafter, values of the gate-source parasitic capacitance Cgs2 and the drain-source parasitic capacitance Cds2 in the high frequency semiconductor device of the present embodiment will be calculated. More specifically, parameters for the calculations are as follows:

distance between the GaAs FET chip 110 and the substrate 151=about 2.0 $\mu$m;

dielectric constant of photocurable insulating resin 125= about 10.0;

length of the gate electrode 102=about 100 $\mu$m;

width of the gate electrode 102=about 1.0 $\mu$m;

length of the drain electrode 103=about 100 $\mu$m;

width of the drain electrode 103=about 20 $\mu$m;

the number of the gate electrodes 102 is 6; and the number of the drain electrodes 103 is 3.

For the purpose of comparison, suppose that the ground electrode 152 exists also in the region facing the gate electrode 102 and the drain electrode 103 as in the conventional example. In that case, the results of calculations using the above-described parameters show the gate-source parasitic capacitance Cgs2=about 0.027 pF and the drain-source parasitic capacitance Cds2=about 0.0135 pF. On the other hand, in the substrate 151 according to Embodiment 2 of the present invention; the parasitic capacitances Cgs2 and Cds2 become negligibly small values.

Thus, since the parasitic capacitances Cgs2 and Cds2 are extremely small, the high frequency semiconductor device according to Embodiment 2 of the present invention has effects as described hereinafter. More specifically, the reduction in the parasitic capacitance Cgs2 effects an improvement in the maximum cutoff frequency, while the reduction in the parasitic capacitance Cds2 leads to improvements in the drain efficiency and in distortion characteristics. Moreover, since the amount of each of the parasitic capacitances is not affected by the height of the bump after mounting, variations in high frequency characteristics are reduced. As a result, production yield is stabilized. In addition, the source inductance is reduced even if the height of the bump 111 is shortened, and therefore, the parasitic capacitance Is not changed. Thus, a reduction in the inductance and a reduction in the parasitic capacitance are simultaneously achieved.

As described above, according to the present embodiment, the ground electrode 152 on the substrate 151 is formed in a comb shape in accordance with the electrode structure of the GaAs FET chip 110, so that the ground electrode 152 does not exist in the region opposing to the gate electrode 102 and the drain electrode 103. Therefore, the parasitic capacitances between the GaAs FET chip 110 and the substrate 151 can be made negligibly small. As a result, improved operation characteristics of the high frequency semiconductor device can be obtained in a stable manner, and the production yield of the device is improved.

Embodiment 3

Figure 6A:
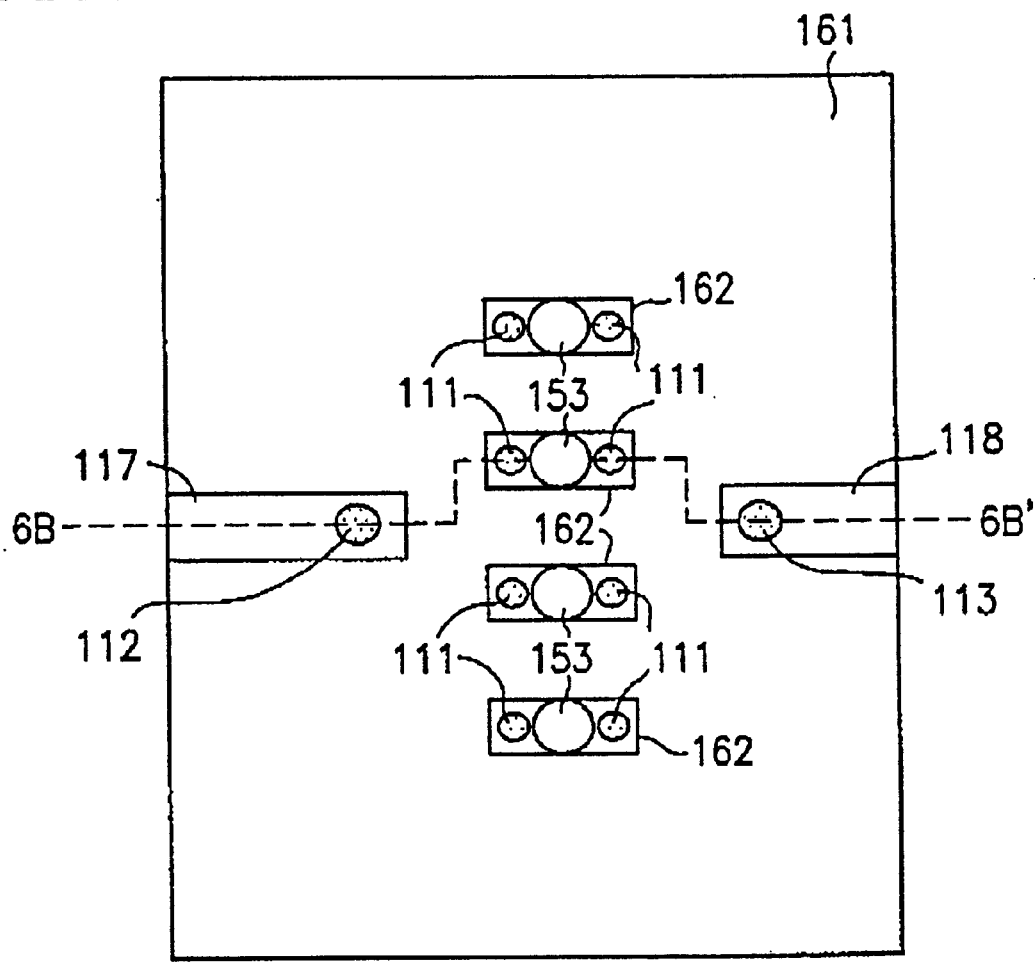
FIG. 6A is a plan view showing a flip chip mounting substrate to be Included in a high frequency semiconductor device according to Embodiment 3 of the present invention.
Figure 6B:
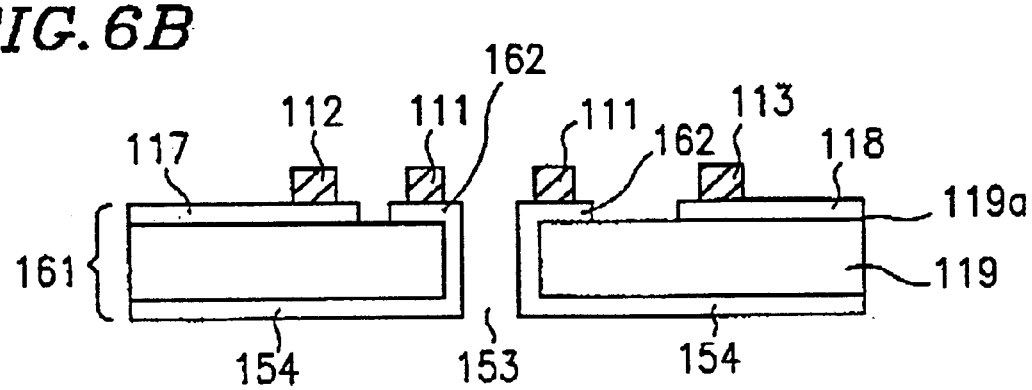
FIG. 6B is a cross-sectional view showing the fila chip mounting substrate taken along line 6B–6B' in FIG. 6A.
Figure 7:
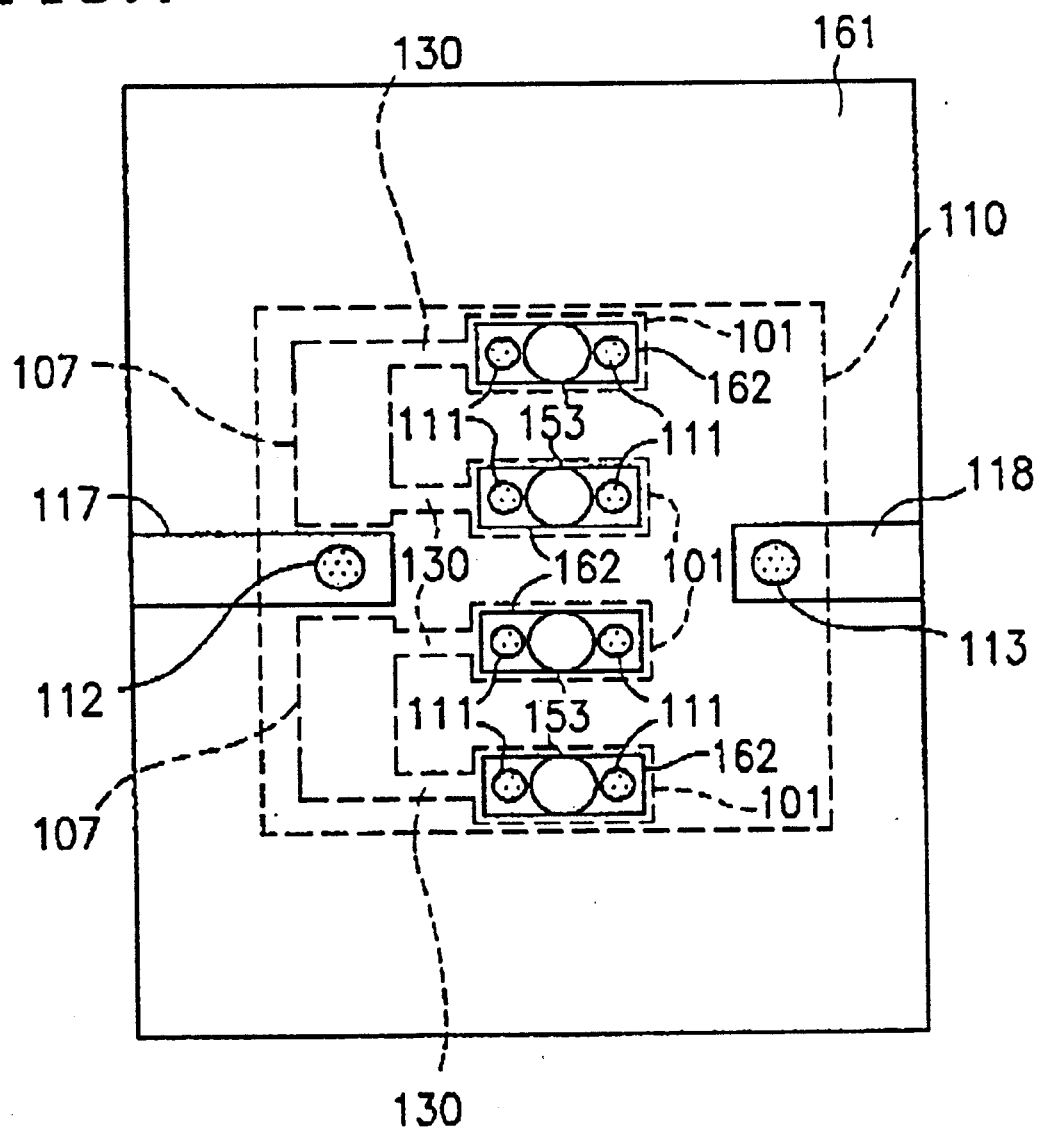
FIG. 7 is a plan view showing the positional relationship between a source electrode and a ground electrode in the high frequency semiconductor device according to Embodiment 3 of the present invention.

FIG. 6A is a plan view of a flip chip mounting substrate 161 to be included in a high frequency semiconductor device according to Embodiment 3 of the present invention. FIG. 6B is a cross-sectional view of the flip chip mounting substrate taken along line 6B–6B' in FIG. 6A. FIG. 7 is a view for illustrating the positional relationship between a source electrode 101 and a ground electrode 162 in the high frequency semiconductor device according to the present embodiment.

The high frequency semiconductor device of Embodiment 3 includes the flip chip mounting substrate 161 shown in FIG. 6A and the GaAs FET chip 110 shown in FIG. 2. However, unlike Embodiment 2 described with reference to FIGS. 3 to 5, according to the device of this embodiment, the ground electrode 162 to be provided on the substantially flat principal surface 119a of the substrate 161 is formed not in a comb shape but in an isolated island shape.

Bumps 111 and a through hole 153 are provided in each of the ground electrodes 162. A bump 112 and a bump 113 are provided on an input line 117 and an output line 118, respectively. The side surface of the through hole 153 is metallized so as to electrically connect the ground electrode 162 and a ground terminal 154 via the through hole 153.

In order to reduce inductance between the ground electrode 162 and the ground terminal 154, it is effective to increase the number of the through holes 153 and to increase the diameter of the through hole 153. On the other hand, however, in order to prevent the occurrence of cracking due to the heat cycle history of the substrate 161 containing aluminum nitride as a main component and to realize a reduction in the production cost, it is in general necessary to reduce the number of the through holes 153 to be provided in the substrate 161 as much as possible. When the number of the through holes 153 is reduced, however, the inductance between the ground electrode 162 and the ground terminal 154 may be increased, thereby deteriorating the high frequency characteristics.

Thus, in the present embodiment, the through hole 153 is provided adjacent to the bumps 111. As a result, the inductance between the ground terminal 154 and the bump 111 is effectively reduced. Moreover, by providing the ground electrode 162 so as not to face the gate extension line 105 in addition to the gate electrode 102 and the drain electrode 103 of the GaAs FET chip 110, the gate-source capacitance Cgs2 between the GaAs FET chip 110 and the substrate 151 is further reduced. Thus, in the high frequency semiconductor device of this embodiment having the structure shown in FIGS. 6A and 6B, as compared to the device of Embodiment 2, satisfactory high frequency characteristics are obtained without increasing the number of the through holes 153.

As described above, the ground electrode 162 on the substrate 161 is formed in an island shape, and the bumps 111 and the through hole 153 are formed adjacent to each other in the ground electrode 162 according to the present embodiment. As a result, with the reduced number of the through holes 153, the inductance between the ground terminal and the bumps can be effectively reduced. Thus, without sacrificing operation characteristics of the resultant high frequency semiconductor device, reliability with respect to the heat cycle history of the substrate containing aluminum nitride as a main component can be enhanced.

Embodiment 4

Figure 8:
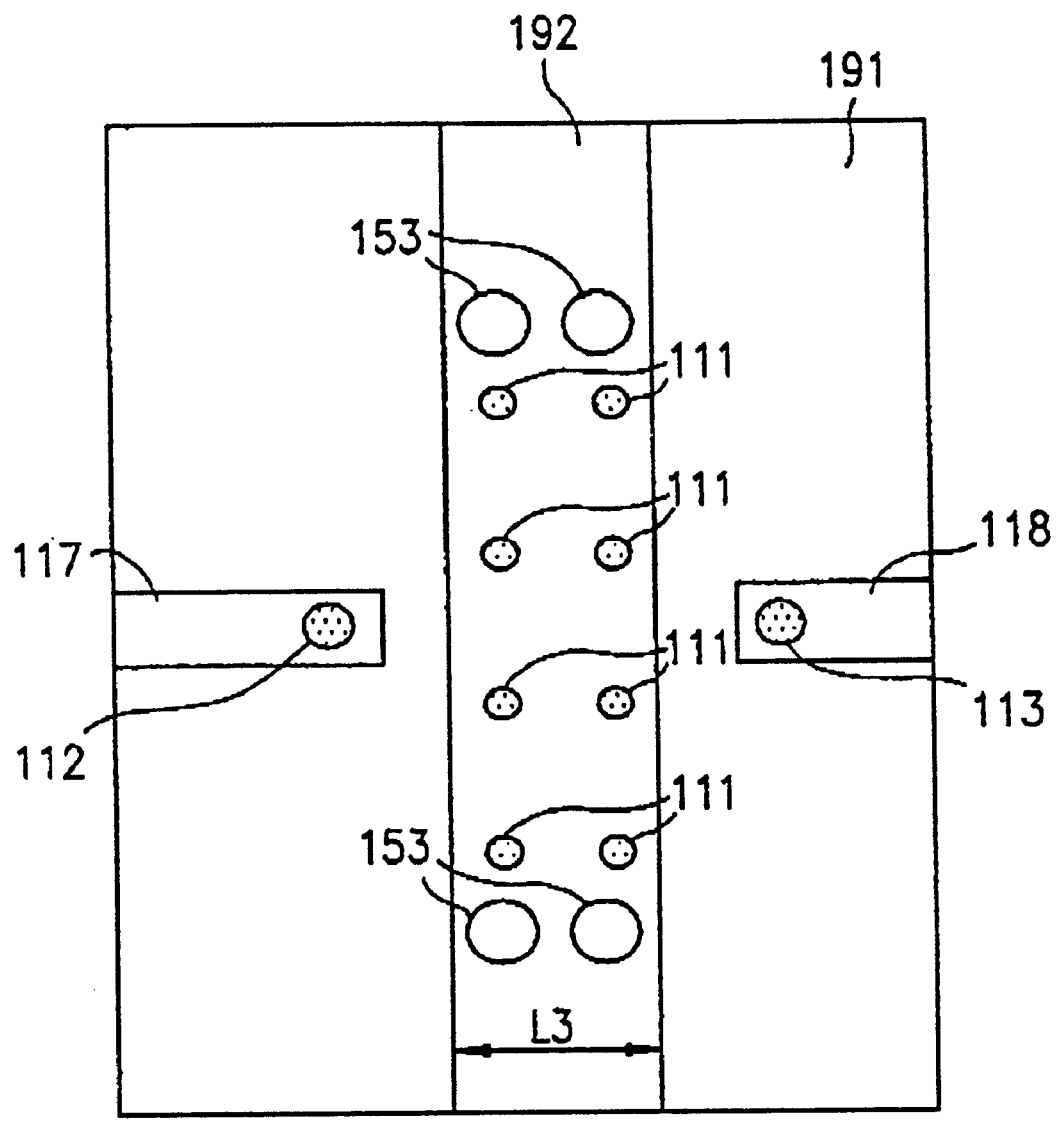
FIG. 8 is a plan view showing a flip chip mounting substrate to be included in a high frequency semiconductor device according to Embodiment 4 of the present invention.
Figure 9:
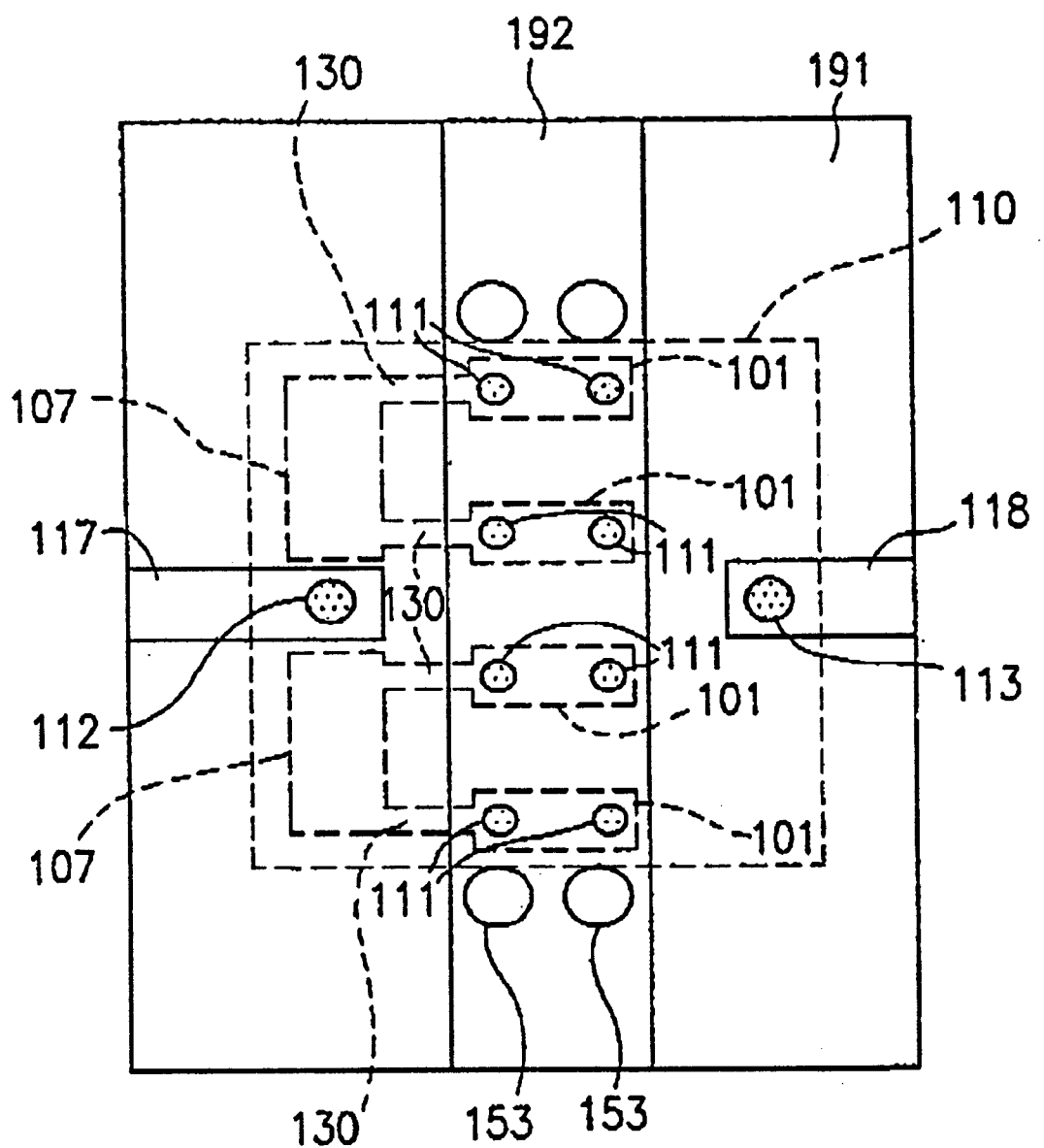
FIG. 9 is a plan view showing the positional relationship between a source electrode and a ground electrode in the high frequency semiconductor device according to Embodiment 4 of the present invention.

FIG. 8 is a plan view showing a flip chip mounting substrate 191 to be included in a high frequency semiconductor device according to Embodiment 4 of the present invention. FIG. 9 is a view illustrating the positional relationship between source electrodes 101 and a ground electrode 192 in the high frequency semiconductor device of this embodiment.

The principal surface of the substrate 191 is a substantially flat surface, and the band-shaped ground electrode 192 is provided thereon. On the back surface of the substrate 191, which is opposite to the principal surface, a ground terminal (not shown) is provided as in FIGS. 6A and 6B. The ground electrode 192 is electrically connected to the ground terminal via through holes 153.

The ground electrode 192 is not formed in a region opposing to the gate extension line and the drain extension line. In other words, the gate extension line and the drain extension line substantially have no region opposing to the ground electrode 192, thereby generating no parasitic capacitance therebetween.

More specifically, a width L3 of the ground electrode 192 is set to be smaller than a distance L4 between the gate extension line 105 and the drain extension line 106 of the FET shown in FIG. 2. If the width L3 is too small, the inductance component becomes non-negligible. Thus, it is preferable to set the width L3 so as to be about the same value as the length L5 along the longitudinal direction of the source electrode 101 shown in FIG. 2.

As compared to the substrate according to Embodiment 2 or Embodiment 3, the substrate 191 having the above described circuit pattern has a simpler pattern of the ground electrode 192, thereby allowing an easier fabrication.

By employing the substrate 191 according to Embodiment 4, the parasitic capacitance between the gate extension line and the ground electrode 152 and the parasitic capacitance between the drain extension line and the ground electrode 152 can be eliminated. In addition, by employing the ground electrode 192 having a simple pattern, operation characteristics of the high frequency semiconductor device can be improved.

Embodiment 5

Figure 10:
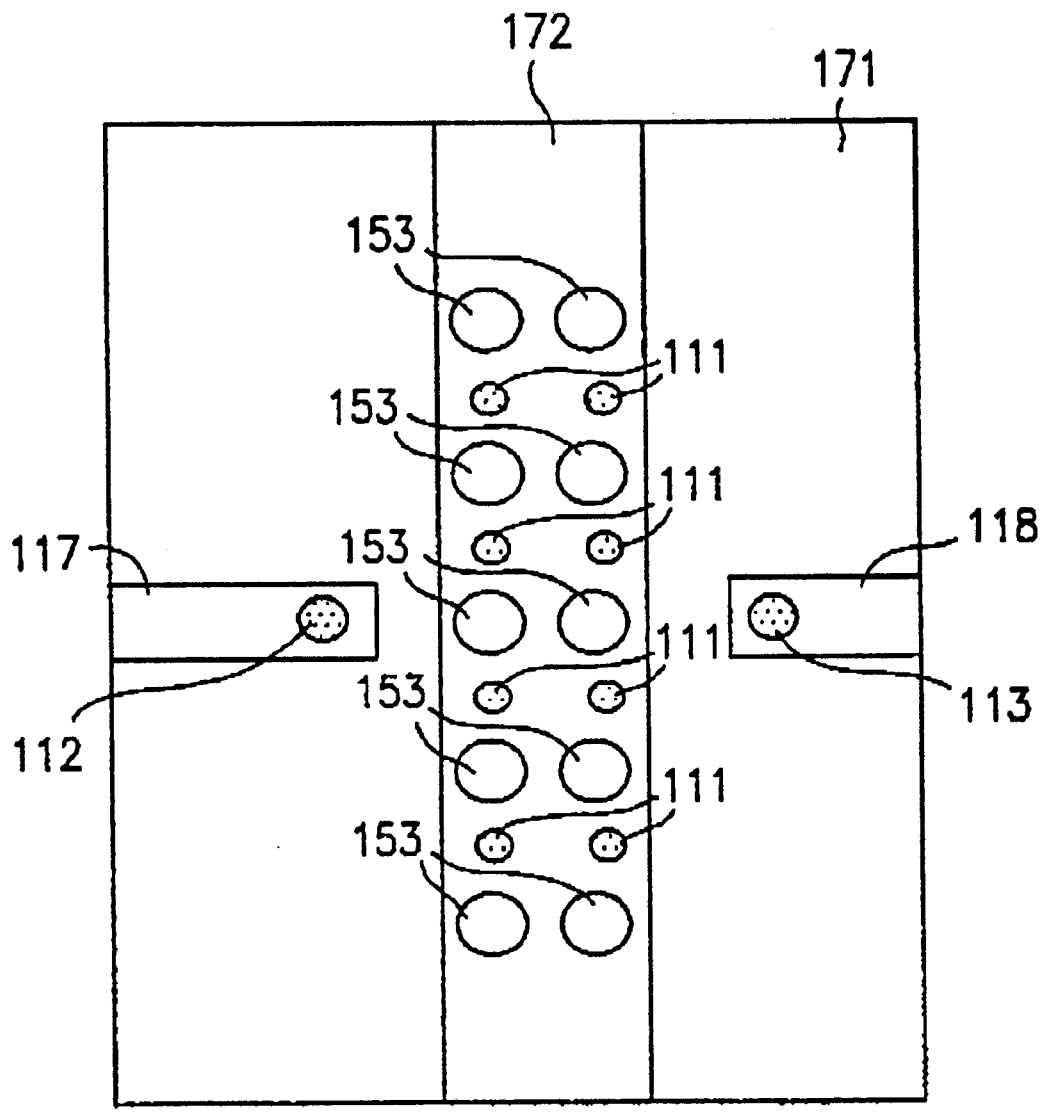
FIG. 10 is a plan view showing a flip chip mounting substrate to be included in a high frequency semiconductor device according to Embodiment 5 of the present invention.
Figure 11:
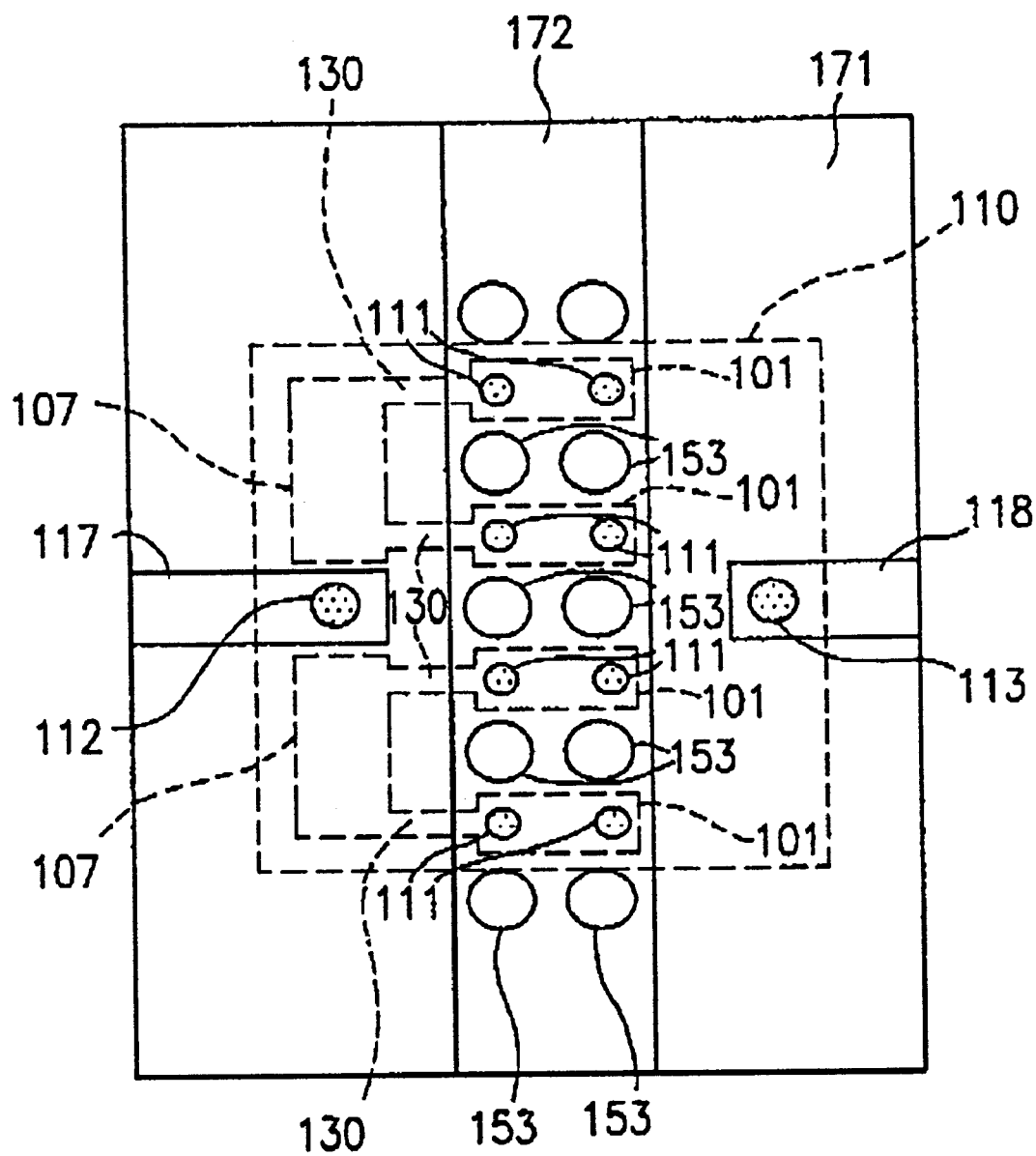
FIG. 11 is a plan view showing the positional relationship between a source electrode and a ground electrode in the high frequency semiconductor device according to Embodiment 5 of the present invention.

FIG. 10 is a plan view showing a flip chip mounting substrate 171 to be included in a high frequency semiconductor device according to Embodiment 5 of the present invention. FIG. 11 is a view illustrating the positional relationship between source electrodes 101 and a ground electrode 172 in the high frequency semiconductor device of this embodiment.

The principal surface of the substrate 171 is a substantially flat surface, and the band-shaped ground electrode 172 is provided thereon. On the back surface of the substrate 171, which is opposite to the principal surface, a ground terminal (not shown) is provided as in FIGS. 6A and 6B. Embodiment 5 differs from Embodiment 4 in that two bumps 111 provided adjacent to each other and two through holes 153 provided adjacent to each other are disposed in an alternate manner within the ground electrode 172. By providing the bumps 111 and the through holes 153 in such an adjacent manner, the inductance between the ground electrode 172 and the bumps 111 is effectively reduced. In addition, by providing the through holes 153 in regions opposing to the gate electrode and the drain electrode of the GaAs FET chip 110, parasitic capacitances Cgs2 and Cds2 between the GaAS FET chip 110 and the substrate 171 can be reduced.

As described above, by forming the ground electrode 172 in a band shape on the substrate and by forming the bumps 111 disposed adjacent to each other and the through holes 153 disposed adjacent to each other in an alternate manner within the ground electrode 172, the inductance between the ground terminal and the bumps 111 can be effectively reduced. Moreover, by forming the through holes 153 at places opposing to the gate electrode and the drain electrode of the FET 110, the parasitic capacitance existing between the FET chip 110 and the substrate 171 is reduced.

Herein, results of a comparison among the characteristics of the aforementioned high frequency semiconductor devices according to Embodiments 2 to 5, with particular attention to their inductances and their parasitic capacitances, are shown in Table 1 below.

TABLE 1

| Embodiment 2 | Inductance=⊙ | Parasitic capacitance=⊙ | Simplicity of pattern=⊙ |
|---|---|---|---|
| Embodiment 3 | Inductance=Δ | Parasitic capacitance=o | Simplicity of pattern=Δ |
| Embodiment 4 | Inductance=○ | Parasitic capacitance=Δ | Simplicity of pattern=o |
| Embodiment 5 | Inductance=o | Parasitic capacitance=Δ | Simplicity of pattern=○ |

In Table 1, each of marks ⊙, O, and Δ represents a relative degree of an improvement with respect to the characteristics in the conventional example, such that ⊙ indicates a greatest improvement, and O represents a greater degree of improvement than that represented by Δ.

As shown in Table 1, in the high frequency semiconductor device according to Embodiment 2, all of the characteristics are improved. In the high frequency semiconductor devices according to Embodiments 3 to 5, on the other hand, in each embodiment, one of the three characteristics is particularly effectively improved. More specifically, in the high frequency semiconductor device according to Embodiment 3, the parasitic capacitance is especially reduced. In the high frequency semiconductor device according to Embodiment 4, easy pattern formation is especially realized. In the high frequency semiconductor device according to Embodiment 5, inductance is especially reduced.

Embodiment 6

Although the bumps are formed in the substrate according to Embodiments 2 to 5, bumps are formed in a GaAs FET chip in Embodiment 6 of the present invention.

Figure 12:
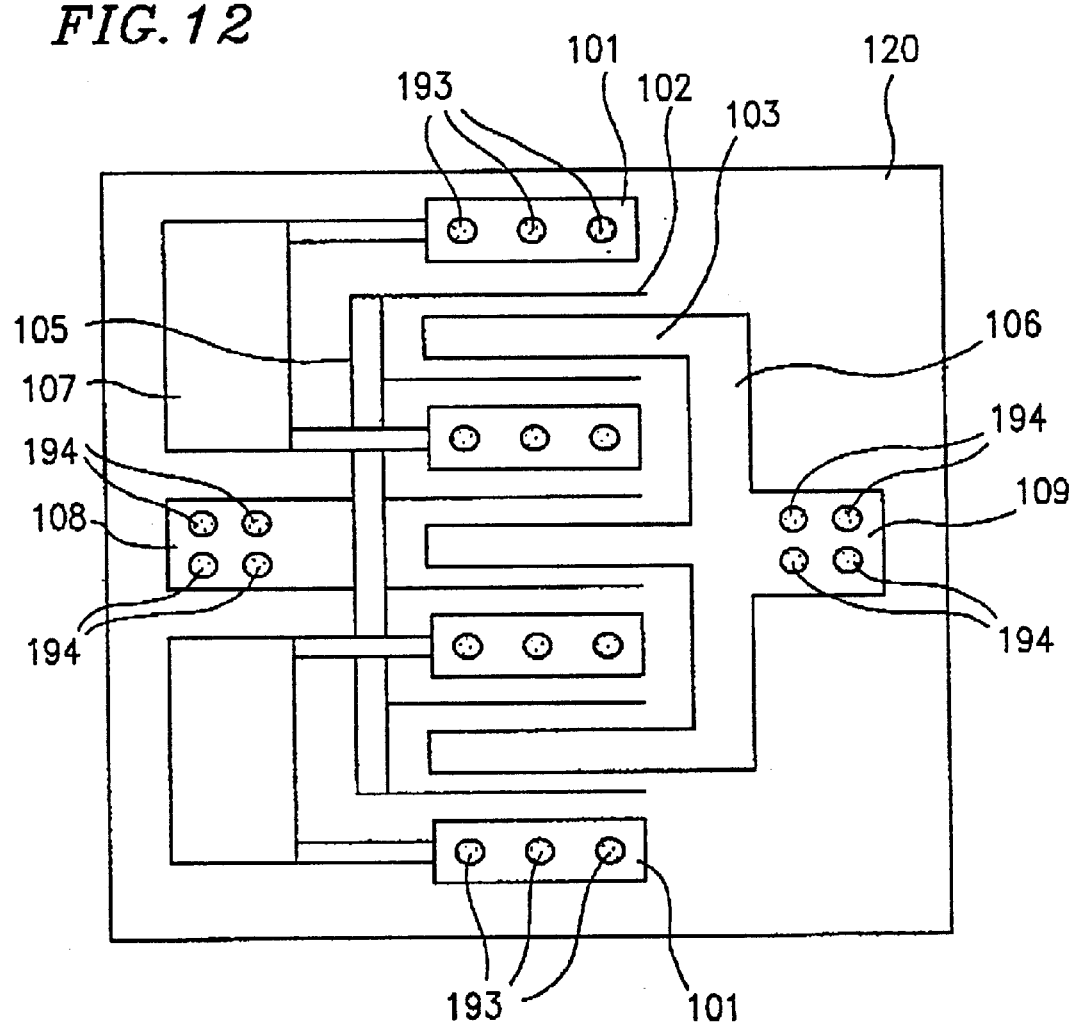
FIG. 12 is a plan view showing a FET chip to be included in a high frequency semiconductor device according to Embodiment 6 of the present invention.

FIG. 12 is a plan view showing the GaAs FET chip 120 to be included in a high frequency semiconductor device according to Embodiment 6 of the present invention. The fundamental structure of the GaAs FET chip 120 is the same as that of the GaAs FET chip 110 shown in FIG. 2. As described above, the GaAs FET chip 120 shown in FIG. 12 includes the bumps 193 and 194 provided on the electrodes of the chip. More specifically, the bumps 193 are formed on a source electrode 101, whereas the bumps 194 are formed on a gate electrode pad 108 and a drain electrode pad 109. In this case, the bumps are not formed on a substrate (not shown) on which the GaAs FET chip 120 is mounted.

The gate electrode pad 108 and drain electrode pad 109 and the source electrode 101 have different sizes and shapes. In such a case, if only one bump is to be formed on each of the gate electrode pad 108, the drain electrode pad 109, and the source electrode 101 so as to correspond to the respective shape of the electrode or the pads, the bumps on the gate electrode pad 108 and the drain electrode pad 109 and the bump on the source electrode 101 have different sizes. Such different sizes of the bumps lead to stress concentration on the bump having a larger area upon performing the MBB mounting, thereby causing non-uniformity in the applied stress. As a result, electrical connection may not be sufficiently formed.

In the structure shown in FIG. 12, on the source electrode 101, the three bumps 193 disposed along the longitudinal direction of the source electrode 101 are formed, while four bumps 194 are formed on the gate electrode pad 108 and the drain electrode pad 109. By substantially equalizing the size of each of the bumps 193 with that of each of the bumps 194, stress is uniformly applied to each of the bumps 193 and 194 upon performing the MBB mounting. As a result, those bumps are compressed by substantially the same amount, resulting in satisfactory electrical connection.

As described above, by forming the bumps 193 on the source electrode 101 and the bumps 194 on the gate electrode pad 108 and the drain electrode pad 109 in a divided manner, respectively, and by substantially equalizing the size of each of the bumps 193 with that of the bumps 194, satisfactory electrical connection between the substrate and the FET chip 120 is achieved at the time of the MBB mounting.

Embodiment 7

By the study made by the inventors of the present application, it was found that the photocurable resin for adhering may be leaked from the through holes provided in the substrate when the Gas FET chip is mounted on the substrate using the MBB mounting method in the high frequency semiconductor devices of the aforementioned embodiments. If such a resin leakage occurs, the predetermined amount of the photocurable resin does not exist between the GaAs FET chip and the substrate. As a result, a sufficient level of adhering strength cannot be maintained.

As a method for solving this problem, forming the through hole outside the mounting area of the GaAs FET may be considered. In such a case, however, the distance between the through hole and the source electrode is extended, thereby increasing its inductance. This leads to a gain reduction, for example, in the case where the high frequency semiconductor device is a power amplifier.

Thus, according to Embodiment 7 of the present invention, the through hole is previously filled with resin or the like so that no resin leakage occurs upon performing the MBB mounting even when, for example, the through hole exists immediately below the GaAs FET. With such a structure, it becomes possible to form the through hole in the vicinity of the GaAs FET chip or immediately below the GaAs FET chip to further reduce undesirable inductance. As a result, when the high frequency semiconductor device is a power amplifier, for example, an increase in gain is realized.

As a resin to be used for filling the through hole, a conductive paste (e.g., a metal paste) is preferable since it can also serve to secure an electrical connection. In addition, the upper surface of the resin is preferably positioned at the same level as the surface of the substrate or rather at a lower level than the surface of the substrate. This is because if the upper surface of the resin is raised from the surface of the substrate, the resin may interfere with the MBB mounting of the GaAs FET chip.

As described above, according to this embodiment, by filling the through hole with an appropriate resin or the like, the leakage of the photocurable resin at the time of the mounting via the through holes can be suppressed and the inductance of the through hole can be reduced. Consequently, in the case where the high frequency semiconductor device constitutes an power amplifier, its gain can be improved.

Embodiment 8

Figure 13:
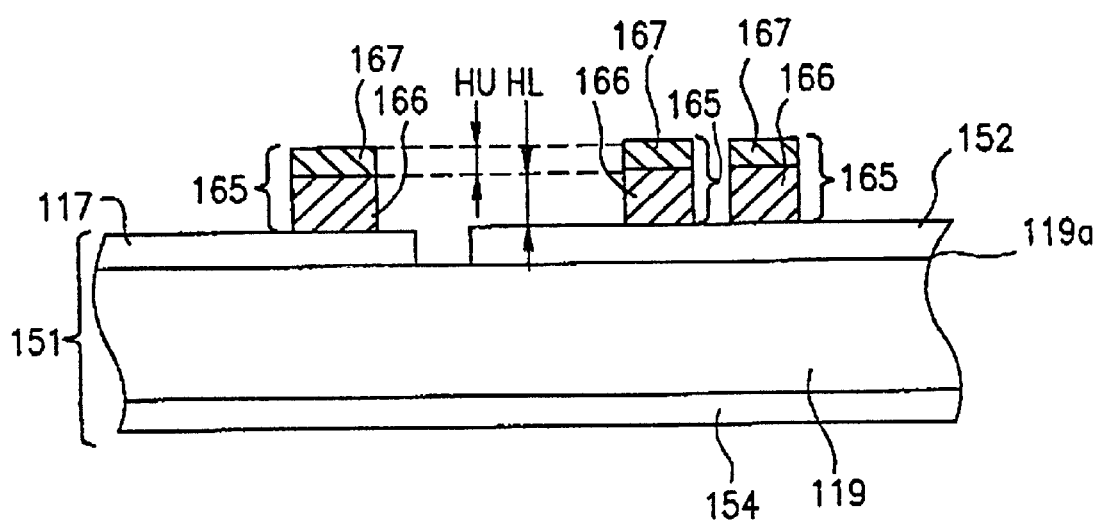
FIG. 13 is a plan view showing a flip chip mounting substrate to be included in a high frequency semiconductor device according to Embodiment 8 of the present invention.

FIG. 13 is a cross-sectional view, showing a flip chip mounting substrate 151 to be included in a high frequency semiconductor device according to Embodiment 8 of the present invention.

The substrate 151 of this embodiment essentially has the same structure as that of Embodiment 2 described with reference to FIG. 3A. However, although the bumps 111 to 113 are made substantially of a single metal (i.e., Au) in Embodiment 2, bumps 165 each having two-layered structure made of materials having respectively different hardnesses are formed in the present embodiment. More specifically, a lower section 166 of the bump 165 is formed of a material having a hardness greater than that of an upper section 167 of the bump 165. Preferably, the ratio of the Vickers hardness of the lower section 166 to the Vickers hardness of the upper section 167 is set to be about 3 or greater. The lower section 166 contains, for example, gold (Au) as a main component, and the upper section 167 contains, for example, indium (In) as a main component.

When a high frequency semiconductor device is fabricated using the MBB method, a threshold voltage of the FET may vary before and after the MBB mounting of the GsAs FET chip. The mechanism of such a reduction in the threshold voltage, which had been unknown previously, became clear as described hereinbelow, as a result of the study made by the inventors of the present application.

The aforementioned change in the threshold voltage is caused by a subtle stress applied to the channel of the GaAs FET. More specifically, as described with reference to FIGS. 19A to 19E, during the step of connecting the source electrode of the FET chip to the ground electrode of the substrate using the MBB method, the bumps are compressed to be deformed and stuck into the source electrode of the FET. The FET chip is fixed to the substrate in such a state by the curing of the photocurable insulating resin. In such a case, since the source electrode of the FET chip is provided in the vicinity of the channel region, the subtle stress is also applied to the channel, which in turn generates piezo charges in the vicinity of a metal constituting the gate, resulting in the threshold value of the FET being varied.

When a threshold voltage of the FET is varied, its bias point is changed. As a result, predetermined high frequency characteristics can no longer be obtained. In particular, a high electron mobility transistor (HEMT) utilizing two-dimensional electron gas is susceptible to such an influence, thereby causing a problem.

Therefore, in the present embodiment, as shown in FIG. 13, the bumps 165 each having the two-layered structure of the lower section 166 and the upper section 167 are provided on an input line 117 and a ground electrode 152 of the high frequency substrate 151. A thickness HL of the lower section 166 is typically about 8 $\mu$m, for example. A thickness HU of the upper section 167 is typically about 2 $\mu$m, for example. The upper section 167 substantially made of indium can be formed using a plating method in the same manner as in the formation of the lower section 166 substantially made of gold.

By using indium which is an extremely soft metal as a material for the upper section 167 of the bump, the stress generated when the bump 165 is compressed can be eased. Therefore, according to the present embodiment, as compared to the flip chip mounting substrate using the gold bump alone, the variation in threshold voltage after the mounting by the MBB method can be significantly suppressed.

The metal which can be used for the upper section 167 of the bump is not limited to pure indium. The same effect can be obtained when any other material satisfying the aforementioned condition regarding hardness (e.g., a soft alloy containing indium) is used.

Embodiment 9

Figure 14:
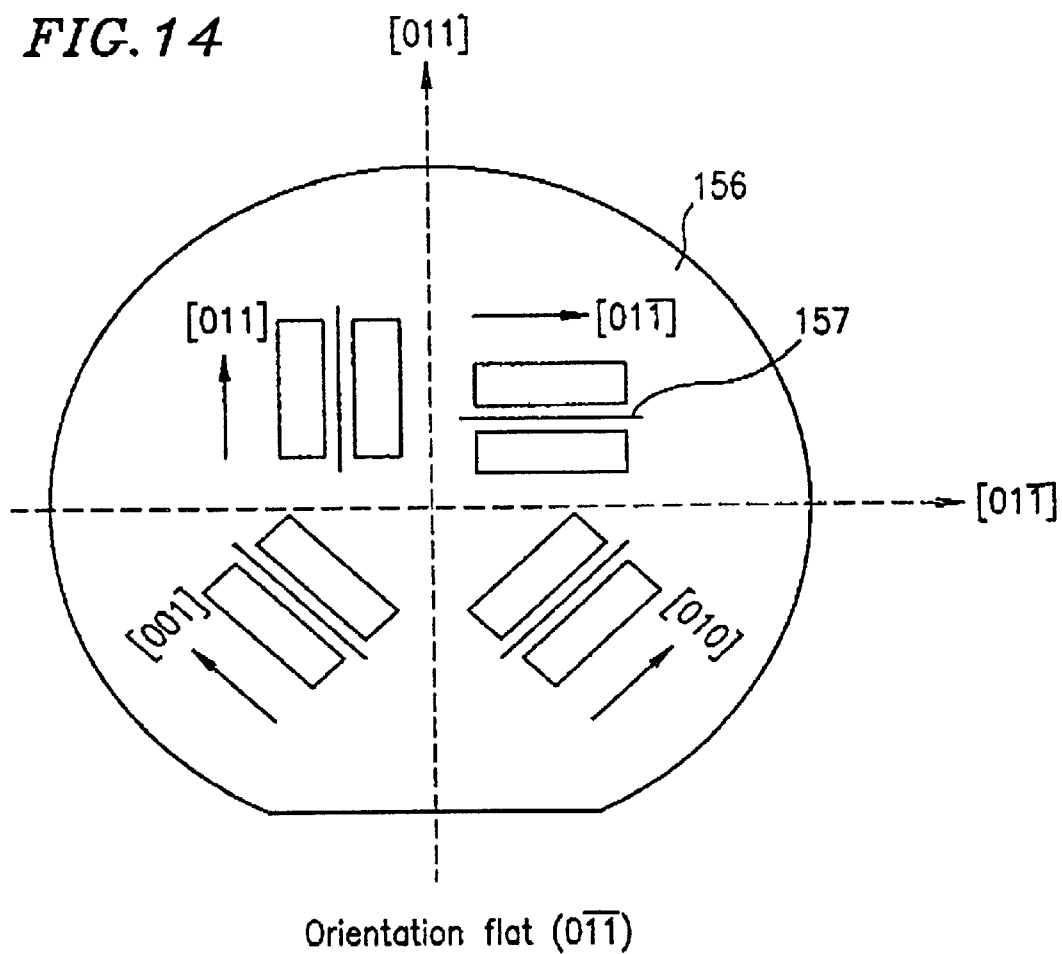
FIG. 14 is a general view showing various possible gate directions of an FET formed on a GaAs wafer to be used for forming a high frequency semiconductor device of the present invention.

FIG. 14 is a schematic view illustrating various directions of a gate electrode 157 (i.e., gate directions) in a GaAs wafer 156 to be used for forming a high frequency semiconductor device according to the present embodiment, each representing a possible direction of FETs to be formed on the GaAs wafer 156. The direction of the principal surface of the GaAs wafer 156 is (100), and the direction of its orientation flat is (0, /1, /1). Herein, "(bar)" shown in FIG. 14 is represented by "/(slush)" in this specification. More specifically, FETs which have gate electrodes 157 aligned along directions of [011], [01/1], [010], and [001], respectively, are schematically shown on the wafer 156.

Each of the FETs having these gate directions was actually fabricated, and the stability in threshold value thereof before and after the MBB mounting was evaluated. As a result, the FETs having the gate direction of [010] or [001] exhibited stable characteristics. It can be considered that this is because the occurrence of piezo charges caused by the stress applied to the source electrodes of the FETs can be suppressed in the FETs having the gate direction of [010] or [001].

Based on the above-described new findings obtained by the inventors of the present application, according to the present invention, by forming the FETs having the gate direction of [010] or [001] on the wafers, the variation in threshold voltage thereof before and after the MBB mounting of the FET chips is significantly suppressed.

Embodiment 10

Figure 15:
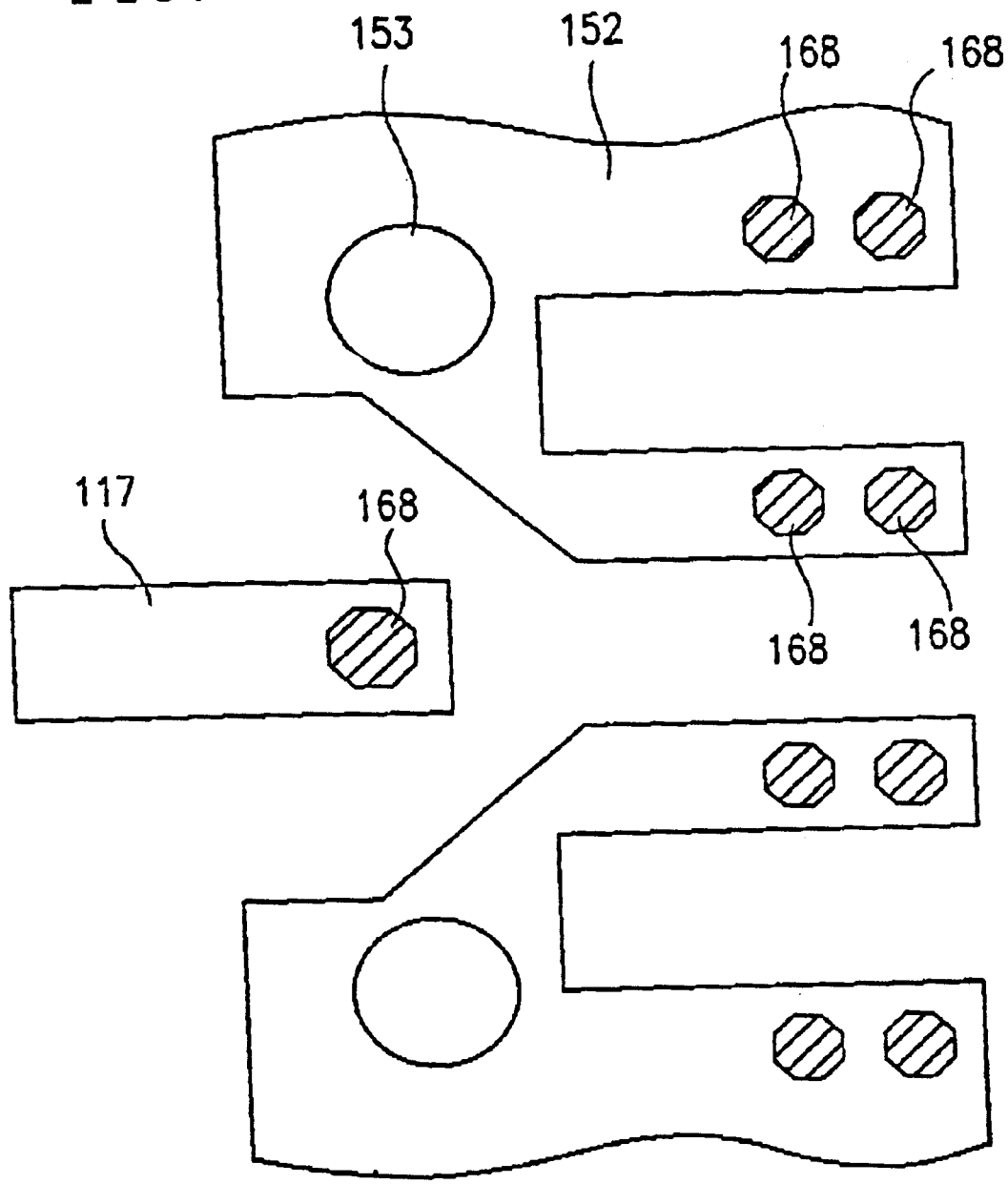
FIG. 15 is a view for schematically illustrating bumps used in a high frequency semiconductor device according to Embodiment 10 of the present invention.

FIG. 15 is a view for schematically illustrating bumps to be used in a high frequency semiconductor device according to Embodiment 10 of the present invention.

A substrate of this embodiment has basically the same structure as that of Embodiment 2 described with reference to FIG. 3. Although the bump with a circular cross-sectional shape is formed according to Embodiment 2, the bumps 168 with octagonal cross-sectional shapes (i.e., octagonal-cylindrical-shaped bumps) are formed on a ground electrode 152 and an input line 117 according to the present embodiment.

As described before, during the step of connecting the source electrode of the FET chip to the ground electrode of the substrate using the MBB method, bumps are compressed to be deformed and stuck into the source electrode of the FET. At this time, the bump is compressed from the original height of about 10 $\mu$m to the height of about 2 $\mu$m. Accompanying with the reduction in height, the base area of the bump is increased to be about 2.2 times as large as its original base area. On the other hand, the source electrode of the FET chip is formed in a rectangular shape. Thus, the shape of the bottom surface of the compressed bump is preferably polygonal in order to increase a contact area between the bump and the source electrode as much as possible.

As a result of the study made by the inventors of the present application based on the consideration of the above-described points, it was confirmed that the contact area between the bump and the source electrode can be increased by using the bumps 168 having polygonal cross-sectional shapes. By employing a polygonal shape having the number of sides greater than that of a square, in particular, protrusion caused by non-uniform deformation of the bottom surface of the bump when connection is made, resulting in a parasitic capacitance between such a protrusion and the gate electrode or drain electrode of the FET via a surface protecting film interposed therebetween, can be prevented from occurring. Thus, stable high frequency characteristics can be realized.

Embodiment 11

Figure 16:
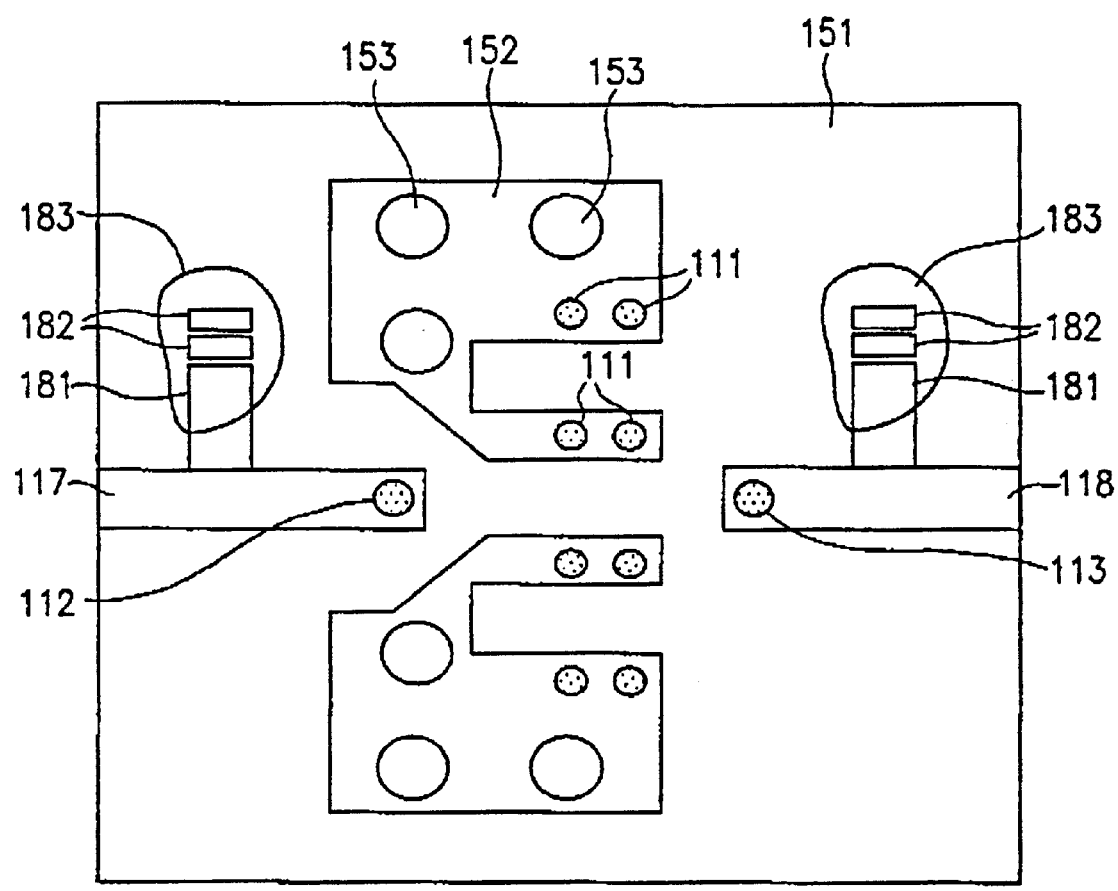
FIG. 16 is a plan view showing a flip chip mounting substrate to be included in a high frequency semiconductor device according to Embodiment 11 of the present invention.

FIG. 16 is a plan view showing a flip chip mounting substrate to be included in a high frequency semiconductor device according to Embodiment 11 of the present invention.

The substrate according to the present embodiment basically has the same structure as that of the substrate of Embodiment 2 described with reference to FIG. 3. According to Embodiment 11, however, resists 183 are applied to predetermined areas for the purpose of being used in a removal step of the photocurable insulating resin spread over the peripheral area of the FET chip due to the MBB mounting.

In a high frequency such as a millimeter wave band in which its wavelength is extremely short, it is necessary to perform adjustment of impedance in the very vicinity of the FET chip. In FIG. 16, open stubs 181 are connected to an input line 117 and an output line 118. In the vicinity of each of the tips of the open stubs 181, an impedance adjusting pattern 182 is provided. In the case where impedance adjustment as required to be performed after mounting the FET chip on the substrate using the MBB method, the open stub 181 and the impedance adjusting pattern 182 are generally connected to each other using a bonding were. However, if the photocurable insulating resin 125 is spread over these areas, such an impedance adjustment cannot be performed.

In view of the above, according to the present embodiment, the resist 183 is previously applied onto the open stub 181 and the impedance adjusting pattern 182, so that the photocurable insulating resin 125 is spread over the applied resist 183. Thus, the spread photocurable insulating resist 125 can be easily removed with the resist 183, so that it becomes possible to perform the impedance adjustment in the very vicinity of the FET chip. As a result, it becomes possible to fabricate a high frequency semiconductor device capable of dealing with a higher high frequency region by employing the MBB mounting.

In addition, even when the photocurable insulating resin 125 is spread over the impedance adjusting pattern 182, by removing the resist 183 and the spread portion of the photocurable insulating resin 125 over the resist 183, impedance adjustment can be performed without damaging the impedance adjusting pattern 182 itself. As a result, production yield of the high frequency semiconductor device is improved.

Although each of the embodiments of the present invention having various characteristics is individually described hereinabove, contents of two or more of these embodiments may be properly combined to structure a high frequency semiconductor device.

Moreover, although in the aforementioned description, a single FET chip is mounted on the substrate, the present invention can be also applied to the case where a plurality of the FET chips are mounted on the substrate so as to form, for example, a MMIC structure. Furthermore, the number of the unit FETs to be included in each FET chip is not limited to 6, which is referred in connection with Embodiment 1, and one or any other plural number of the unit FETs may be included therein.

As described above, according to the present invention, the effects at least as described hereinafter can be obtained in the high frequency semiconductor device in which the FET chip is mounted on the substrate using the flip chip mounting (i.e., MBB mounting) method.

(1) Without sacrificing the high frequency characteristics, it becomes possible to perform the DC testing of the FET chip in a wafer state, thereby significantly improving the yield of the high frequency semiconductor device.

(2) Since the parasitic capacitance between the FET chip and the substrate can be made negligibly small, frequency characteristics of the high frequency semiconductor device is improved and the variation in characteristics is reduced.

(3) Since the inductance between the ground terminal and the bump can be reduced with a reduced number of the through holes, reliability with respect to the heat cycle history of a substrate (e.g., a substrate containing aluminum nitride as a main component) can be enhanced without sacrificing the characteristics of the high frequency semiconductor device.

(4) Since the stress applied at the time of the compression of the bump can be reduced, variation in the threshold voltage of the FET chip before and after the MBB mounting can be suppressed.

(5) Since the contact area between the bump and the source electrode can be increased while suppressing an increase in parasitic capacitance, high frequency characteristics and heat releasing property of the high frequency semiconductor device are improved.

(6) By previously forming a predetermined resist pattern, even when the photocurable insulating resin used for fixing the FET chip with the substrate is spread, by removing the spewed photocurable insulating resin with the resist, it becomes possible to perform impedance adjustment in the very vicinity of the mounted FET chip. Thus, the high frequency semiconductor device which can deal with a higher frequency band can be fabricated by using the MBB mounting.

Moreover even when the above-described photocurable resin is spewed over the impedance adjusting pattern, by removing the resist and the spread portion of the photocurable insulating resin over the resist, impedance can be adjusted without damaging the adjusting pattern itself. As a result, production yield of the high frequency semiconductor device is improved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A high frequency semiconductor device, comprising:
   a substrate having a substantially flat principal surface configured for stable and reliable flip chip mounting, with a predetermined circuit pattern including at least an input line, an output line, and a ground electrode provided on the principal surface; and
   a transistor which has a drain electrode, a source electrode, and a gate electrode and is mounted on the substrate by a flip chip mounting,
   wherein the source electrode and the ground electrode are connected to each other by a first bump in the flip chip mounting, and
   a through hole having a conductive pattern on an inside surface thereof, filled with a metal, for supplying a ground potential to the ground electrode is provided in at least in a portion of a region opposing to the drain electrode or the source electrode in the ground electrode.

2. A high frequency semi conductor device according to claim 1,
   wherein the transistor further comprises:
     a source electrode pad which is electrically connected to the source electrode by a source extension line; and
     a gate electrode pad which is electrically connected to the gate electrode by a gate extension line,
   and wherein a width of the source extension line at an overlapped area of the source extension line and the gate extension line is smaller than a width of the source electrode.

3. A high frequency semiconductor device according to claim 1, wherein each of the drain electrode and the gate electrode comprise a first region and a second region, wherein at least one of said first and second regions do not oppose the around electrode.

4. A high frequency semiconductor device according to claim 1, wherein the transistor comprises a first region and a second region, wherein said second region does not oppose the ground electrode; and at least one of the drain electrode and the gate electrode is formed only in the second region.

5. A high frequency semiconductor device according to claim 4, wherein both of the drain electrode and the gate electrode are formed only in the second region of the transistor.

6. A high frequency semiconductor device according to claim 4, wherein the ground electrode has a comb-shaped pattern.

7. A high frequency semiconductor device according to claim 4, wherein the ground electrode has an island-shaped pattern.

8. A high frequency semiconductor device according to claim 1, wherein:
   the ground electrode is formed in a band shape;
   the transistor further includes a source electrode pad which is electrically connected to the source electrode by a source extension line and a gate electrode pad which is electrically connected to the gate electrode by a gate extension line; and
   a width of the ground electrode is smaller than a distance between the drain extension line and the gate extension line.

9. A high frequency semiconductor device according to claim 1, wherein the first bump has a layered structure including a lower bump layer and an upper bump layer provided on the lower bump layer; and a hardness of the lower bump layer is different from a hardness of the upper bump layer, such that a ratio of Vickers hardness of the lower bump layer to Vickers hardness of the upper bump layer is greater than about 3, which provides a suppression in a variation of a threshold voltage.

10. A high frequency semiconductor device according to claim 1, wherein the first bump has a cross section of a substantially n-sided shape (where n is an integer equal to or greater than 4).

11. A high frequency semiconductor device according to claim 1, wherein a plurality of the first bumps are provided; and each of the plurality of the first bumps has substantially the same size.

12. A high frequency semiconductor device according to claim 1, further comprising a second bump for electrically connecting at least one of the gate electrode and the drain electrode to the circuit pattern on the substrate, wherein the second bump has substantially the same size as the first bump.

13. A high frequency semiconductor device according to claim 12, wherein a plurality of the first bumps and a plurality of the second bumps are provided; and each of the plurality of the first bumps and the plurality of the second bumps has substantially the same size.

14. A high frequency semiconductor device according to claim 1, wherein the flip chip mounting is performed by a microbump bonding method, wherein the parasitic inductance caused by the first bump is substantially suppressed.

15. A high frequency semiconductor device according to claim 1, wherein the substrate is a (100) substrate; and the transistor is mounted on the substrate so that a longitudinal direction of the gate electrode is substantially parallel to a {010} direction of the substrate.

16. A high frequency semiconductor device according to claim 1, wherein the substrate is a (100) substrate; and the transistor is mounted on the substrate so that a longitudinal direction of the gate electrode is substantially parallel to a {001} direction of the substrate.

17. A high frequency semiconductor device, comprising:

a substrate having a substantially flat principal surface, with a predetermined circuit pattern including at least an input line, an output line, and a ground electrode provided on the principal surface; and a transistor which has a drain electrode, a source electrode, and a gate electrode and is mounted on the substrate by a flip chip mounting, wherein the source electrode and the ground electrode are connected to each other by a first bump in the flip chip mounting, wherein the transistor further comprises:

a source electrode pad which is electrically connected to the source electrode by a source extension line, and a gate electrode pad which is electrically connected to the gate electrode by a gate extension line, and wherein a width of the source extension line at an overlapped area of the source extension line and the gate extension line is smaller than a width of the source electrode, and wherein a ratio of the width of the source extension line at the overlapped area of the source extension line and the gate extension line to the width of the source electrode is in the range of up to 0.5.

* * * * *